US012567470B2

(12) United States Patent
Steiner et al.

(10) Patent No.: US 12,567,470 B2
(45) Date of Patent: Mar. 3, 2026

(54) SYSTEM AND METHOD FOR DYNAMIC INTER-CELL INTERFERENCE COMPENSATION IN NON-VOLATILE MEMORY STORAGE DEVICES

(71) Applicant: Kioxia Corporation, Tokyo (JP)

(72) Inventors: Avi Steiner, Tel Aviv (IL); Hanan Weingarten, Tel Aviv (IL); Yasuhiko Kurosawa, Fujisawa (JP)

(73) Assignee: KIOXIA CORPORATION, Tokyo (JP)

( * ) Notice: Subject to any disclaimer, the term of this patent is extended or adjusted under 35 U.S.C. 154(b) by 32 days.

(21) Appl. No.: 17/406,929

(22) Filed: Aug. 19, 2021

(65) Prior Publication Data

US 2023/0057711 A1    Feb. 23, 2023

(51) Int. Cl.
| | |
|---|---|
| *G11C 16/34* | (2006.01) |
| *G06F 3/06* | (2006.01) |
| *G11C 16/04* | (2006.01) |
| *G11C 16/26* | (2006.01) |

(52) U.S. Cl.
CPC ........ *G11C 16/3427* (2013.01); *G06F 3/0619* (2013.01); *G06F 3/0659* (2013.01); *G06F 3/0679* (2013.01); *G11C 16/0483* (2013.01); *G11C 16/26* (2013.01)

(58) Field of Classification Search
CPC . G11C 16/3427; G11C 16/0483; G11C 16/26; G06F 3/0619; G06F 3/0659; G06F 3/0679
See application file for complete search history.

(56) References Cited

U.S. PATENT DOCUMENTS

| | | | |
|---|---|---|---|
| 9,349,477 B2 | 5/2016 | Chen et al. | |
| 9,704,594 B1 | 7/2017 | Qin et al. | |
| 10,614,897 B1* | 4/2020 | Steiner | G11C 16/0483 |
| 10,771,094 B2 | 9/2020 | Horisaki | |
| 11,158,386 B2* | 10/2021 | Park | G11C 16/3427 |
| 11,205,498 B1* | 12/2021 | Berman | G11C 7/06 |
| 11,355,204 B2* | 6/2022 | Bhatia | G11C 16/3404 |
| 11,514,999 B2* | 11/2022 | Zhang | G06N 3/0499 |
| 11,610,116 B2* | 3/2023 | Zhang | G06N 3/08 |
| 11,626,168 B2* | 4/2023 | Berman | G11C 16/3418 |
| | | | 714/764 |

(Continued)

OTHER PUBLICATIONS

Computing Optimal LDPC Decoding Voltages for Flash Memory, Technical Disclosure Commons, (Dec. 7, 2021) https://www.tdcommons.org/dpubs_series/4775.*

(Continued)

*Primary Examiner* — Vanthu T Nguyen
(74) *Attorney, Agent, or Firm* — Foley & Lardner LLP

(57) ABSTRACT

A method for dynamically estimating interference compensation thresholds of a page of memory includes performing a mock read on a target row using a mock read threshold, performing a read operation on an interference source and reading an interference state of the interference source, computing a histogram and a corresponding threshold based on the mock read threshold and the interference state of the interference source, and estimating a read threshold to dynamically compensate the interference state of the target row based on the histogram.

24 Claims, 15 Drawing Sheets

500

| Mock read target row 502 |
|---|

| Perform read on interference source row 504 |
|---|

| Compute histogram 506 |
|---|

| Estimate read-thresholds for reduced interference 508 |
|---|

| Perform read on target row and hard decode 510 |
|---|

(56) References Cited

U.S. PATENT DOCUMENTS

2014/0237200 A1    8/2014  Dar
2020/0327947 A1    10/2020  Park et al.

OTHER PUBLICATIONS

Office Action with Search Report issued in Taiwanese application No. 111130050, dated Jul. 27, 2023.
Office Action issued in Chinese Application No. 202210980126.4, dated Dec. 23, 2025.

* cited by examiner

Mock read target row 502

Perform read on interference source row 504

Compute histogram 506

Estimate read-thresholds for reduced interference 508

Perform read on target row and hard decode 510

500

SYSTEM AND METHOD FOR DYNAMIC INTER-CELL INTERFERENCE COMPENSATION IN NON-VOLATILE MEMORY STORAGE DEVICES

TECHNICAL FIELD

The present arrangements relate generally to memory devices and more particularly to obtaining improved endurance and average read performance for non-volatile memory storage devices by mitigation of interference of adjacent cells.

BACKGROUND

As the number and types of computing devices continue to expand, so does the demand for memory used by such devices. Memory includes volatile memory (e.g. RAM) and non-volatile memory (e.g., flash memory or NAND-type flash). A non-volatile memory array includes rows and columns (strings) of cells. A cell may include a transistor and be associated with a single bit.

During a read operation, an entire row/page of the non-volatile memory array may be read. This may be done by applying a bias voltage to all rows not being read and a reference threshold voltage to the row that should be read. The bias voltage may allow the transistor of the non-volatile memory array to fully conduct. The cells on the row being read will conduct if the threshold voltage is sufficiently high to overcome the trapped charge in the floating gate. A sense amplifier may be connected to each string which measures the current through the string and outputs either a "1" or a "0" depending whether the current passed a certain threshold.

As non-volatile memory cell sizes become smaller, the scaling down of the memory cell sizes may cause an increase in the parasitic capacitance coupling between neighboring cells (floating gate transistors) in a memory block. This phenomenon, called "inter-cell interference" (ICI), may cause errors in memories, leading to degradation in endurance and read performance for non-volatile memory storage devices.

Non-volatile memory storage devices may implement fast programming methods which may induce high levels of interference during the programming to neighboring rows because the neighboring rows are less isolated from the target programmed row. Additionally, correlated rows may suffer from an increased level of ICI during various stress conditions. For example, following a retention stress on a device, the ICI level may increase, meaning that the optimal read threshold for ICI compensation may change.

SUMMARY

The present arrangements relate to methods for obtaining improved endurance and improved average read performance for non-volatile devices by mitigation of interference of adjacent cells.

According to certain aspects, a method for dynamically estimating interference compensation thresholds of a page of flash memory includes performing a mock read on a target row using a mock read threshold; performing a read operation on an interference source and reading an interference state of the interference source, computing a histogram and a corresponding threshold based on the mock read threshold and the interference state of the interference source, and estimating a read threshold to dynamically compensate the interference state of the target row based on the histogram.

According to other aspects, a method for dynamically estimating interference compensation thresholds of a page of memory using soft information comprising: defining a target group of bits based on an interference state of the target group of bits based on the interference sampling, determining a histogram and a corresponding threshold, and estimating, a read threshold for the target group of bits.

According to yet other aspects, a memory system includes a page of flash memory having a plurality of rows; and a circuit for performing operations of the page of flash memory, the circuit being configured to: perform a mock read on a target row using a mock read threshold; perform a read operation on an interference source and reading an interference state of the interference source; compute a histogram and a corresponding threshold based on the mock read threshold and the interference state of the interference source; and estimate a read threshold to dynamically compensate the interference state of the target row based on the histogram.

According to other aspects, a non-transitory processor-readable medium containing processor-readable instructions, such that, when executed by one or more processors, performs a method for dynamically estimating interference compensation thresholds of a page of memory by: performing a mock read on a target row using a mock read threshold; performing a read operation on an interference source and reading an interference state of the interference source; computing a histogram and a corresponding threshold based on the mock read threshold and the interference state of the interference source; and estimating a read threshold to dynamically compensate an interference noise of the target row based on the histogram.

According to yet other aspects, a memory system comprising: a page of memory having a plurality of rows; and a circuit for performing operations of the page of memory, the circuit being configured to: define a target group of bits based on an interference state of the target group of bits based on interference sampling; determine a histogram and a corresponding threshold; and estimate a read threshold for the target group of bits.

According to other aspects, a non-transitory processor-readable medium containing processor-readable instructions, such that, when executed by one or more processors, performs a method for dynamically estimating interference compensation thresholds of a page of memory using soft information by: defining a target group of bits based on an interference state of the target group of bits based on interference sampling; determining a histogram and a corresponding threshold; and estimating, a read threshold for the target group of bits.

BRIEF DESCRIPTION OF THE DRAWINGS

These and other aspects and features of the present arrangements will become apparent to those ordinarily skilled in the art upon review of the following description of specific arrangements in conjunction with the accompanying figures, wherein.

DETAILED DESCRIPTION

Figure 1:
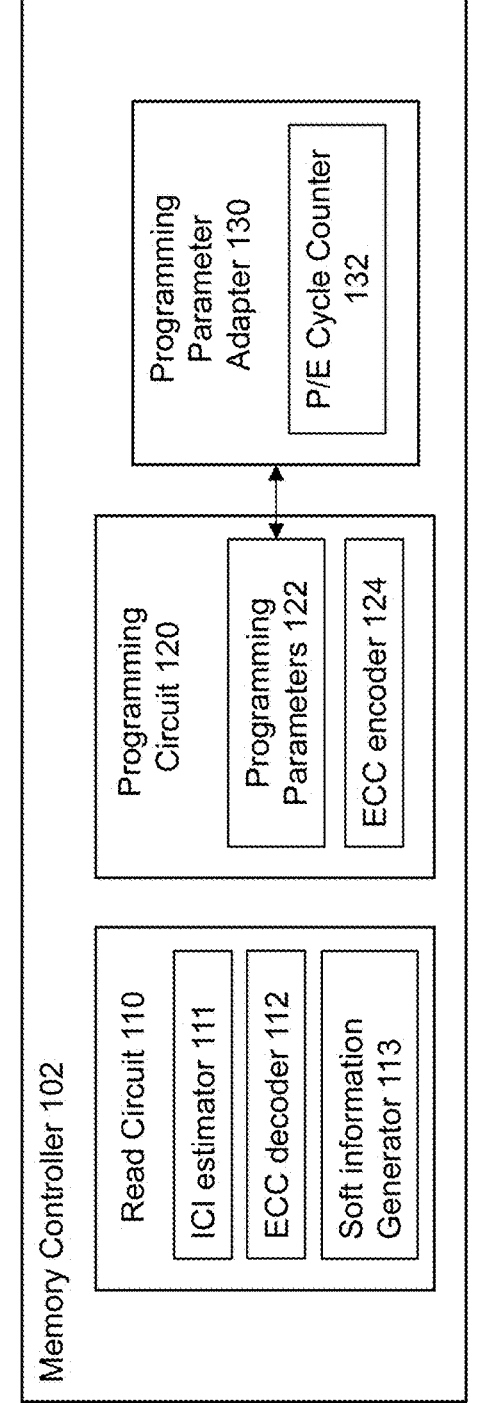
FIG. 1 is a block diagram illustrating a non-volatile storage device according to some arrangements.

According to certain aspects, arrangements in the present disclosure relate to techniques for reading rows which contribute to interference, and dynamically estimating an optimal (or improved) compensation read threshold for a target page using side information of interfering cells, which vary based on the interference level. The target page readout bit error rate (BER) may be minimized (or reduced) by determining ICI compensation thresholds for each physical row. Dynamically estimating the ICI compensation thresholds for reading with a compensated ICI reduces the BER. Classifying various stress conditions and using stress conditions in the ICI compensation threshold analysis may further reduce the BER because stress conditions may induce different interference levels on the target row.

Inherent coupling noise between non-volatile memory cells may occur within planar or three-dimensional (3D) non-volatile memory storage devices. In planar non-volatile memory devices, (1) neighboring cells on the same row and (2) neighboring cells on the same column of an adjacent row may be dominant contributors to ICI. Thus, reliability gains for hard/soft inputs can be obtained by estimating the states of neighboring cells.

The main source of interference may be a programming scheme. For instance, if a row is completely programmed before programming the next row, then the main source of interference may be the programming scheme. For example, during a triple-level cell (TLC) programming, programming of one row may impact a nearby or adjacent row which is already programmed. The cells which are programmed to highest levels may be the source of a stronger interference (than those programmed to levels lower than the highest levels) which may cause unintentional programming of adjacent cells.

However, dense programming non-volatile memory devices (such as NAND storage including quad-level cells (QLC) and five-level cells (PLC)) may include breaking up the programming into multiple steps. For example, the data may be programmed to a given row in a course (initial) setting. Then the adjacent (correlated) row may be programmed coarsely before the target row is programmed in a fine programing stage to final voltage values. This programming method may require more buffering of data and may have lower programming performance, but it may provide a lower BER programming result with reduced interference between correlated cells.

For example, in 3D TLC NAND devices, ICI coupling may be found on adjacent word-lines. Further, stress conditions such as retention or cross-temperature programming and read may have a different level of interference on a target row in 3D NAND devices (or other non-volatile memory storage devices). Accordingly, estimating the interference level, and an optimal compensation dynamically may efficiently decouple ICI.

One or more mock reads may be performed for stress condition classification. Conventionally, a fixed compensation may be applied to the ICI compensation threshold depending on the stress condition class. In the present disclosure, dynamic ICI compensation thresholds for various stress conditions may be determined using a generated database from voltage-threshold scans (VT-scans) on non-volatile memory storage devices under stress conditions. The database for thresholds estimation may be generated for all interference states which are provided in the VT-scans.

Generally, the arrangements in the present disclosure determine optimal (or improved) dynamic ICI compensation thresholds without adding additional reads to a read flow. Minimizing the number of mock threshold reads and ICI reads when estimating dynamic ICI compensation thresholds improves the quality of service by decreasing the BER and increasing the speed of decoding. In some arrangements, a common set of thresholds may be estimated. In other arrangements, there may be separate mock thresholds and compensation thresholds for each ICI state.

Systems and methods are provided for obtaining improved endurance and average read performance for non-volatile memory storage devices by mitigation of interference (i.e., ICI) of adjacent cells. The improved endurance and average read performance may extend the uses of the non-volatile memory storage by increasing device efficiency and reliability under various stress conditions. In some arrangements, sensing may be performed by reading rows which contribute to interference. An optimal (or improved) compensation read threshold for a target page may be dynamically estimated based on the interference state using side information of interfering cells.

In some arrangements, the cell interference side information may be a probability of error in a left side (e.g., left lob tail) or right side (e.g., right lob tail) of a VT distribution due to interference states of neighboring cells. In some arrangements, the cell interference side information may be obtained from pre-fetch of next page reads, or by saving previous read results, depending on interference characteristics. Estimating the interference state using side information is described in U.S. Pat. No. 10,614,897 (the '897 patent), titled "SYSTEM AND METHOD FOR HIGH PERFORMANCE SEQUENTIAL READ BY DECOUPLING OF INTER-CELL INTERFERENCE FOR NON-VOLA- TILE MEMORIES," filed on Sep. 13, 2018, by Avi Steiner and U.S. Pat. No. 10,607,709, titled "SYSTEM AND METHOD FOR EFFICIENT READ-FLOW BY INTER-CELL INTERFERENCE DECOUPLING FOR NON-VOLATILE MEMORIES," filed Sep. 13, 2018 by Avi Steiner, which are both incorporated by reference herein in their entireties. The applications incorporated by reference disclose methods for interference compensation. However, as disclosed herein, interference compensation is improved by dynamically estimating a dynamic compensation for each interference state.

In some arrangements, read thresholds for ICI compensation may be estimated. The read thresholds may be used for a group of bits around a specific threshold for every ICI state. Read operations, or mock-read operations, may be performed to estimate read thresholds for ICI compensation. Several read operations using different thresholds on interfering rows may need to be performed to determine multiple ICI state information. The read operations add overhead, increasing latency. The added latency may exceed hard decoding timing requirements.

Accordingly, in some arrangements, soft sampling may be employed. Performing soft sampling may be advantageous over hard sampling because soft sampling may involve a higher number of additional reads than hard sampling. Soft sampling involves performing multiple reads, where each read operation uses a different one of the read thresholds. Estimating the read thresholds for ICI compensation using soft sampling improves the quality of service of soft sampling by increasing the estimation accuracy. Performing soft sampling to estimate read thresholds for ICI compensation may be more accurate compared to mock read threshold based estimations because soft sampling uses more information around each target threshold. The estimation accuracy of soft sampling may also be improved by estimating optimal compensation thresholds for each ICI state.

The reliability of the soft information (e.g., the soft label) may be a log-likelihood ratio (LLR) value mapped from a hard read value and an interference value. For example, the conditional LLR value of bit b depends on the interference state I, as shown in Expression 1:

$$LLR(b|I) = \log\left(\frac{P(b = 1|I)}{P(b = 0|I)}\right) \tag{1}$$

The systems and methods in the present disclosure may apply ICI compensation after soft sampling to modify the labels of the soft sampling without having to resample the soft input using the estimation results for multiple interference states. Soft sampling and decoding may be described in more detail in U.S. application Ser. No. 16/843,774, titled "DECODING SCHEME FOR ERROR CORRECTION CODE STRUCTURE IN DATA STORAGE DEVICES," filed on Apr. 8, 2020 by Avi Steiner and Hanan Weingarten, and the '897 patent which are both incorporated by reference herein in their entireties.

In some arrangements, the systems and methods for mitigation of interference of adjacent cells as described in the present disclosure can be implemented on a non-volatile memory storage controller (e.g., the memory controller 102 in FIG. 1). In some arrangements, the signal processing operations for mitigation of interference of adjacent cells as described in the present disclosure can be implemented by hardware or software running on a non-volatile memory storage controller (e.g., the memory controller 102 in FIG.

1). Implementing the signal processing operations on the non-volatile memory storage controller hardware (or firmware) may result in low complexity processing. In some arrangements, the signal processing operations for mitigation of interference of adjacent cells as described in the present disclosure can be used for implementation in storage controllers, e.g., solid state drive (SSD) controllers, universal flash storage (UFS) controllers, secure digital (SD) controllers, and the like.

FIG. 1 is a block diagram illustrating a non-volatile storage device 100 according to some arrangements. In some embodiments, the non-volatile storage device may be a flash memory system which can perform any of the methods described in the present disclosure. Examples of the device 100 include but are not limited to, a solid state drive (SSD), a non-volatile dual in-line memory module (NVDIMM), a Universal Flash Storage (UFS), a Secure Digital (SD) device, and so on.

In some arrangements, a different device (not shown) may communicate with the device 100 over a suitable wired or wireless communication link to execute some or all of the methods described herein. The device 100 may include a memory module or memory device 104 and a memory controller 102 for performing operations of the plurality of cells.

The memory controller 102 may include a read circuit 110, a programming circuit (e.g. a program DSP) 120 and a programming parameter adapter 130. In some arrangements, the read circuit 110 may include an ICI estimator 111, an ECC decoder 112 and/or a soft information generator 113. In some arrangements, the programming circuit 120 may include an ECC encoder 124 and programming parameters 122. In some arrangements, the programming parameter adapter 130 may include a program/erase cycle counter 132. Examples of the memory controller 102 include but are not limited to, an SSD controller (e.g., a client SSD controller, a datacenter SSD controller, an enterprise SSD controller, and so on), a UFS controller, or an SD controller, and the like. Arrangements of memory controller 102 can include additional or fewer components such as those shown in FIG. 1.

The memory controller 102 can combine raw data storage in the plurality of memory blocks 106 such that the memory blocks 106 function as a single storage. The memory controller 102 can include microcontrollers, buffers, error correction systems, flash translation layer (FTL) and flash interface modules. Such functions can be implemented in hardware, software, and firmware or any combination thereof. In some arrangements, the software/firmware of the controller 110 can be stored in the memory module 104 or in any other suitable computer readable storage medium.

The memory controller 102 includes suitable processing and memory capabilities for executing functions described herein, among other functions. As described, the memory controller 102 manages various features for the memory block 106 in the memory module 104 including, but not limited to, I/O handling, reading, writing/programming, erasing, monitoring, logging, error handling, garbage collection, wear leveling, logical to physical address mapping, data protection (encryption/decryption), and the like.

In some arrangements, the ICI estimator 111 of the read circuit 110 may be configured to estimate an interference state based on a result of a read operation on a first neighboring cell of a first cell (i.e., a target cell) among the plurality of cells. In some arrangements, a statistical dependency modelling of main interference sources and their impact can be characterized. For example, the ICI estimator 111 may be configured to perform a statistical dependency modelling of interference sources and their impact.

In some arrangements, the statistical dependency modelling of main interference sources and their impact can be characterized offline. For example, statistical dependency modelling may be performed offline when different programming schemes of different non-volatile memory storage devices increases the difficulty of performing statistical dependency modelling online. For example, the programming scheme of one generation of non-volatile memory storage devices may be different from that of another generation of non-volatile memory storage devices.

In some arrangements, the ICI estimator 111 may perform a statistical dependency modelling of interference sources and their impact offline. In some arrangements, to perform such statistical dependency modelling offline for a target non-volatile memory storage device, the ICI estimator 111 or the computing system may store, in memory (e.g., in a mass storage device connected to an I/O (USB, IEEE1394, Small Computer System Interface (SCSI), Serial Advanced Technology Attachment (SATA), Serial Attached SCSI (SAS), PCI Express (PCIe) etc.), at least information on the programming scheme of the target non-volatile memory storage device so that it can accurately model the interference sources and their impact in the target non-volatile memory storage device.

In estimating the interference state, the ICI estimator 111 may be further configured to estimate a level at which the first neighboring cell is programmed. For example, the ICI estimator 111 may estimate, based on a result of a read operation on the first neighboring cell, a level at which the first neighboring cell is programmed. The ICI estimator 111 may then estimate an interference state of the first neighboring cell based on the estimated programmed level of the first neighboring cell. In some arrangements, the interference state of a neighboring cell is an estimated programmed level of the neighboring cell.

In estimating the interference state, the ICI estimator 111 may be further configured to obtain the result of the read operation on the first neighboring cell from pre-fetch of a next page read or by saving a previous read result. For example, in estimating the interference state for a target cell in a target page, the ICI estimator 111 may obtain a read result of a neighboring cell (of the target cell) in a next page that is to be read next to the target page, by pre-fetching the read result of the next page. In some arrangements, the ICI estimator 111 may obtain a read result of a neighboring cell (of the target cell) in a previous page that has been read prior to the target page, by saving and reusing the read result of the previous page. In this manner, in some arrangements, the ICI estimator 111 may be configured to estimate interference states for decoding results of read operations on the plurality of cells by reading the rows of the plurality of cells sequentially and only once. In some arrangements, the ICI estimator 111 may estimate the inference state of a neighboring cell from a distribution of state (or level) programmed in the neighboring cell.

In some arrangements, the ICI estimator 111 may analyze and model the interference state for a target cell as a function of one or more cells adjacent to the target cell. In some arrangements, to analyze the contribution of interference of each neighboring cell, a single neighboring row state estimation may be performed. For example, the ICI estimator 111 can estimate the interference state of a neighboring row from a hard read before decoding. In some arrangements, the ICI estimator 111 can estimate the interference state of a neighboring row post decoding as true data.

In some arrangements, once interference sources and their impact are modeled or identified, simple signal processing operations can be performed to compensate for or decouple the interference. For example, sampling results of a target page can be post-processed to compensate for or decouple the interference. In some arrangements, reliability information for reading or decoding of a target page can be provided. For example, the soft information generator 113 of the read circuit 110 may be configured to generate reliability information (e.g., calculating a probability of error) and provide soft information based on the reliability information. In some arrangements, the soft information generator 113 of the read circuit 110 may be configured to generate soft information based on the estimated interference state and a read value from the first cell. Arrangements of generating soft information and using the soft information generator 113 are further described herein with reference to FIGS. 12-14.

The ECC decoder 112 may be configured to decode soft information as a result of read operations on cells. Additionally or alternatively, the ECC decoder 112 may correct errors, improving accuracy and stress relief of a non-volatile memory storage controller.

The memory controller 102 may also include a programming circuit 120. The programming circuit may include an ECC encoder 124 and programming parameters 122. For example, the ECC encoder 124 may determine the soft labels from the soft samples. The memory controller 102 may also include programming parameter adapter 130. The adapter 130 may adapt the programming parameters 122 in the programming circuit 120. The adapter 130 in this example may include a Program/Erase (P/E) cycle counter 132. Although shown separately for ease of illustration, some or all of the adapter 130 may be incorporated in the programming circuit 120.

The memory module 104 may be an array of memory blocks 106. The memory blocks may include non-volatile memory such as NAND flash memory, dynamic random access memory (DRAM), magnetic random access memory (MRAM), phase change memory (PCM), ferro-electric RAM (FeRAM), and so on. In some arrangements, the memory module 104 may have a plurality of cells. In some arrangements, each of the memory blocks 106 may have a plurality of cells. In some arrangements, the cell memory (e.g., the memory module 104 or a memory block 106) may include rows and columns of the plurality of cells. In some arrangements, a memory block 106 may include a plurality of pages (not shown) and a page may be defined as cells linked with the same word line, which correspond to a row of cells. In some arrangements, neighboring cells of a target cell are cells adjacent to the target cell. For example, each of a first neighboring cell and a second neighboring cell (of a first cell) may be positioned at the same column as a column of the first cell and at a row adjacent to a row of the first cell. Additionally or alternatively, the module 104 can comprise or be implemented using a plurality of dies, each of the dies containing a plurality of the blocks 106.

Figure 2:
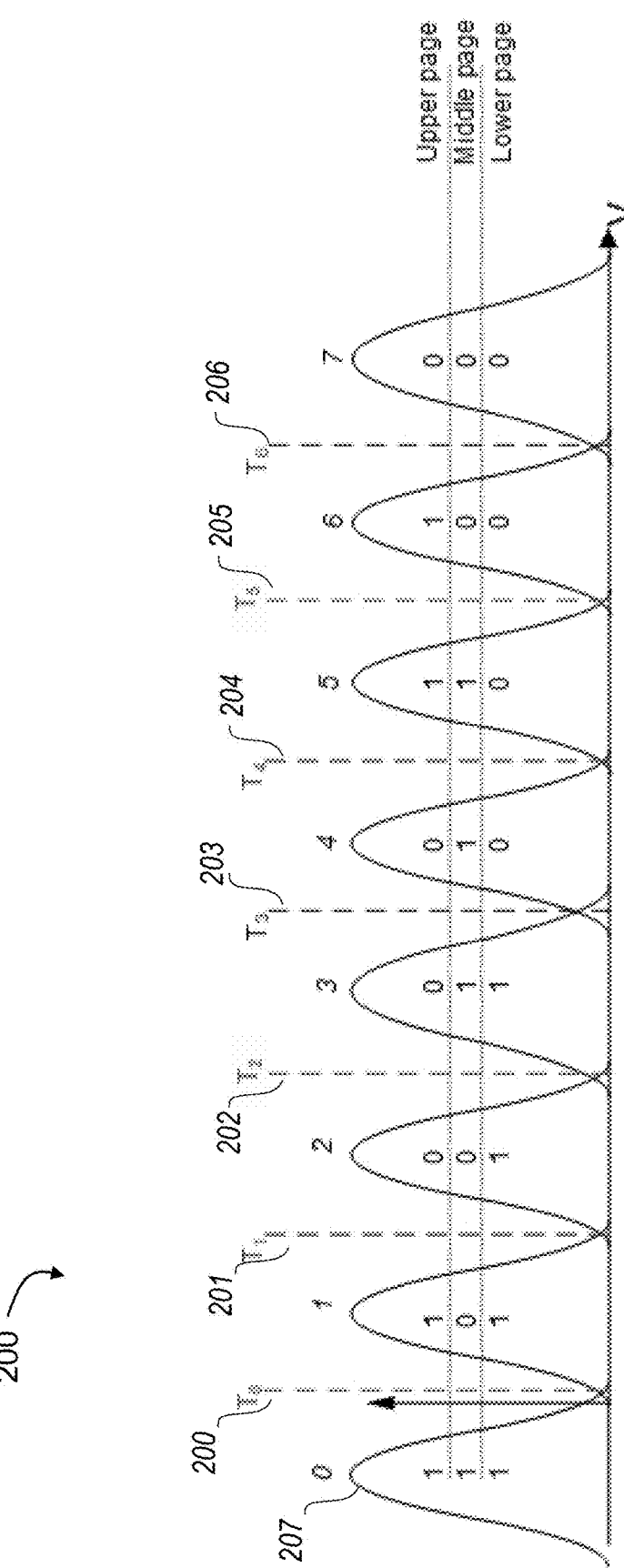
FIG. 2 is a diagram of a superposition of eight possible VT distributions of a three bits per cell flash memory device without any ICI information, according to some arrangements.

Now, arrangements of estimating an interference state will be described with reference to FIG. 2. FIG. 2 is a diagram of a superposition of the eight possible VT distributions 200 of a three bits per cell (bpc) memory device without any ICI information, according to some arrangements. Depicted are eight lobes (distributions, or histograms) corresponding to the eight different bit combinations of three bits represented by the charge state of the cell. A lower page read requires using thresholds $T_3$ 203 to separate the histograms into those with LSBs of 0 and those with LSBs of 1. Read thresholds $T_0$ 200, $T_2$ 202 and $T_5$ 205 are used to separate the histograms into those with LSBs of 0 and those with LSBs of 1 for reading middle pages, and read thresholds $T_1$ 201 $T_4$ 204 and $T_6$ 206 are used to separate the histograms into those with LSBs of 0 and those with LSBs of 1 for reading upper pages. The lower histogram 207 may be considered the erase level.

Figure 3:
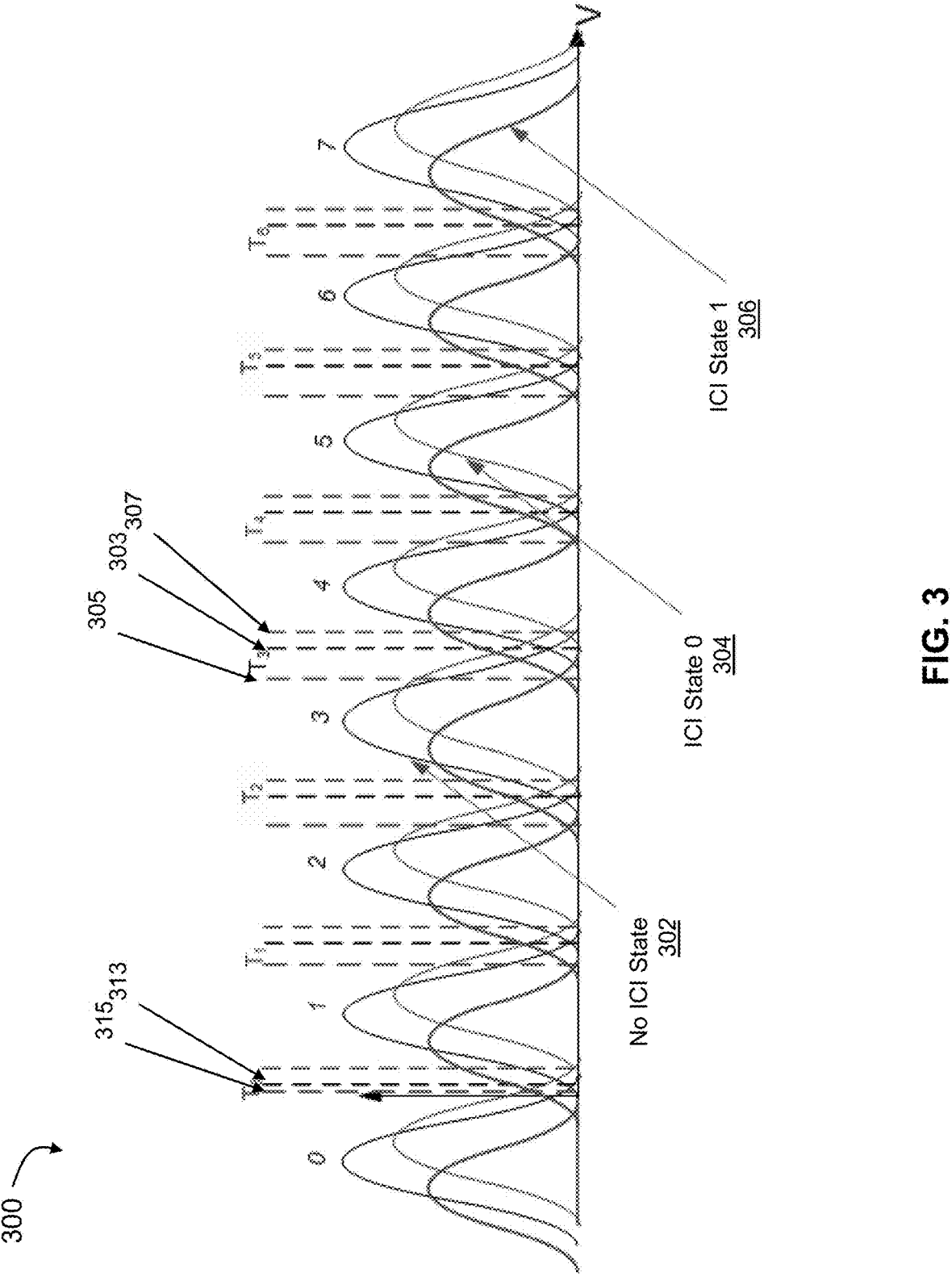
FIG. 3 is a diagram of histograms with VT distributions for each programmed state of a TLC NAND row, according to some arrangements.

FIG. 3 is a diagram of histograms with VT distributions 300 for each programmed state of a non-volatile memory storage device (e.g., a TLC NAND row), according to some arrangements. The VT distributions 300 are conditional information states. The VT distributions 300 may be an example of the histograms and VT distributions determined in the case of one-shot programming with one main source of interference (e.g., interference introduced during programming). A single read using a single threshold (e.g., a single state read) is the minimal overhead that may be added to obtain interference information in a read-flow. As shown, a single read identifies two ICI states, and there are various estimated VTs per histogram.

FIG. 3 may be characterized offline, however no single shift value for compensation will provide the optimal ICI compensation given the interference information, as described further herein. Accordingly, each ICI compensation threshold is offset by a unique voltage from an ideal read threshold (e.g., a read threshold unaffected by ICI).

Histogram 302 identifies the target row to be read. Each of the black dashed thresholds 303 and 313 identify the optimal read threshold (e.g., an ideal read threshold) which provide the minimal output BER per threshold when there is no ICI information available (e.g., an ideal histogram). The single read of the neighboring interfering row results in two induced histograms (e.g., histogram 304 and histogram 306) for the same target row. Histogram 304 and histogram 306 are conditional histograms. The sum of histogram 304 and histogram 306 results in histogram 302.

Histogram 304 corresponds to ICI state 0. Histogram 304 may be obtained by computing the VT distribution for the cells of the target row which correspond to the read result of "0" on the neighboring interfering row. Histogram 304 is shifted to higher voltages (e.g., shifted right from the no ICI state histogram 302) because histogram 304 is associated with the high program disturb of the neighboring row.

Histogram 306 corresponds to ICI state 1. Histogram 306 may be obtained by computing the voltage threshold distribution for the cells of the target row which correspond to the read result of "1" on the neighboring interfering row. Histogram 306 is shifted to lower voltages (e.g., shifted left from the no ICI state histogram 302) because histogram 306 is associated with the lower program disturb from the neighboring row.

Expression 2 below shows that the sum of the BERs associated with the conditional histograms sum to the BER associated without any ICI. The two conditional histograms (e.g., histogram 304 and histogram 306) sum up to the histogram associated with no ICI state (e.g., histogram 302) such that the total BER with ICI compensation is lower than the no ICI state BER.

$$BERnoICI > BERICI\_0 + BERICI\_1 \qquad (2)$$

BERnoICI denotes the read-out BER associated with the no ICI state (e.g., histogram 302), BERICI_0 denotes the read-out BER associated with ICI state 0 (e.g., histogram 304), and BERICI_1 denotes the read-out BER associated with ICI state 1 (e.g., histogram 306).

As compared to the optimal read threshold associated with no ICI state (e.g., threshold 303), each ICI state and associated histograms are associated with different optimal thresholds. Accordingly, a fixed ICI compensation associated with each ICI state may not be efficient in reducing BER.

To demonstrate the need for different ICI compensations for different ICI states, attention is drawn to the thresholds associated with each ICI state. The blue dashed threshold 305 (and threshold 315) is associated with the ICI state 0 and the red dashed threshold 307 is associated with the ICI state 1. As shown, the effect of the ICI is a shift in a known direction. However the conditional ICI distributions (e.g., histogram 304 and histogram 306) have thresholds with varying shifts with respect to the optimal threshold for the original row without ICI information (e.g., histogram 302).

For example, the blue dashed thresholds 305 and 315 are both associated with ICI state 1. Both thresholds are shifted left from threshold 303 and 313 respectively (the threshold representing the optimal threshold with no ICI state). However, the degree of the shift is different, resulting in threshold 305 being different from threshold 315.

Figure 4:
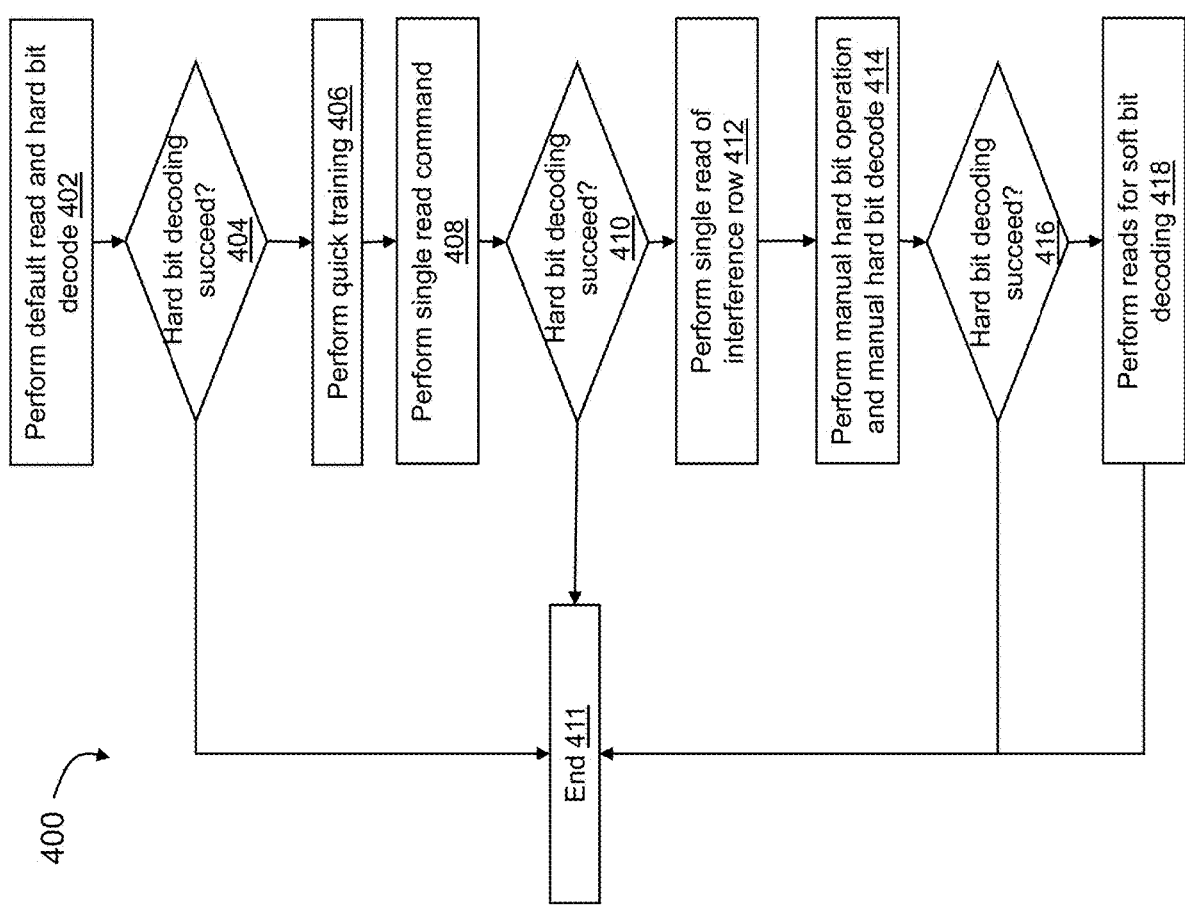
FIG. 4 is a flow chart of a read flow using fixed ICI compensation thresholds, according to some arrangements.

FIG. 4 is a flow chart of a read flow 400 using fixed ICI compensation thresholds, according to some arrangements. For example, the read flow 400 may be performed to determine the fixed compensation thresholds described in FIG. 3 (e.g., histogram 302 associated with thresholds 303 and 313, histogram 304 associated with thresholds 305 and 315, and histogram 306 associated with threshold 307). The read flow 400 provides example read operations using interference information that may be performed to determine fixed ICI compensation thresholds. The maximum number of read operations for the read flow described in FIG. 4 is eight.

In read flow 400, the process beings in block 402 by performing a single read command to read a target row. The single read command can be received in a random manner or at an arbitrary time. In some arrangements, the read command may read using default thresholds. The read command may be performed with default thresholds for the target row as usually performed when minimal (or no) prior information is available on the target page/block. If prior information is available, the first read thresholds may be based on history and/or tracking information instead of the default values. For example, the read thresholds may be the read thresholds associated with the previous read command. In some arrangements, the read command may use the last threshold if the time associated with the read command is less than 70 microseconds. In some arrangements, a hard decoding attempt may be performed on the read results.

In block 404, it may be determined whether hard decoding of the read result of the target page succeeded. If the hard decoding failed (e.g., due to high error rate), the process may proceed to block 406. For example, the decoded BER may not satisfy a threshold (e.g., an accuracy threshold). If the hard decoding succeeded, the process may end at block 411.

In block 406, quick training (QT) is performed. QT may be performed using a linear estimator, as discussed herein. The QT operation may perform a set of read operations (e.g., three full page reads) using mock thresholds. Histograms may be computed from the full page reads and read thresholds for the target page may be estimated. For example, for two ICI states and three reads, seven thresholds and a three bit histograms of eight states may be determined (e.g., VT distribution 300 of FIG. 3). The histogram may be used to compute the quick training thresholds (e.g., new thresholds for reading).

In block 408, a single read command may be performed using the estimated thresholds from block 406. Hard bit decoding may be attempted of the read result on the target page. Block 410 may be similar to block 404. In block 410, it may be determined whether the hard decoding of the read result of the target page succeeded. If the hard decoding failed, the process may proceed to block 412. If the hard decoding succeeded, the process may end at block 411.

In block 412, a single read of a main interference row (e.g., the next word-line row) may be performed to get ICI information.

In block 414, a manual hard bits operation may be performed. The manual hard bit operation may include applying a fixed compensation threshold that is estimated based on the quick training thresholds (e.g., determining in block 406) using fixed shift values as a function of the ICI state (e.g., ICI state 0 or ICI state 1) per threshold. Two additional reads may be performed using the fixed shift of thresholds. A single input hard bit codeword may be formed by choosing the parts according to ICI state information from the two read results. In some arrangements, a hard decoding attempt may be performed on the read results.

Block 416 may be similar to blocks 404 and 410. In block 416, it may be determined whether the hard decoding of the read result of the target page succeeded. If the hard decoding failed, the process may proceed to block 418. If the hard decoding succeeded, the process may end at block 411.

In block 418, two additional reads (or other reads) may be performed to obtain soft bit information such that soft bit decoding may be performed (e.g., using the soft information generator 113 of FIG. 1). The soft bit decoding read flow is described with reference to FIGS. 12 and 14 as described herein.

Figure 5:
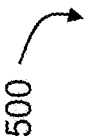
FIG. 5 is a method of dynamically estimating optimum ICI compensation thresholds, according to some arrangements.
Figure 5:
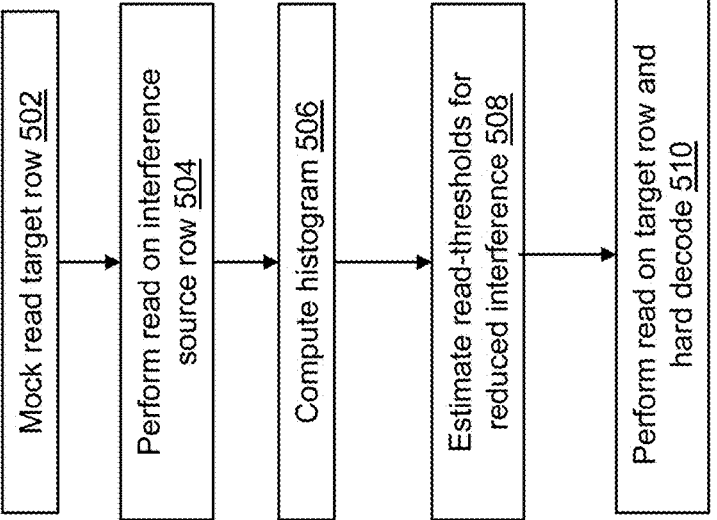

FIG. 5 is a method 500 of dynamically estimating optimum (or improved) ICI compensation thresholds, according to some arrangements. Dynamic estimation of the read thresholds for each ICI state allows ICI compensation to be determined in a way that is matched to the stress condition and actual physical target rows that is currently being read. Estimation results, determined from performing method 500, may be used to allow the hard decoding of inputs with reduced error rate resulting from dynamic interference reduction. For example, the estimation results may be used to perform two reads from a target row using the estimated thresholds from method 500.

In this example, the process beings in block 502 where a mock read of a target row is performed. The mock read may be a read with predefined thresholds which are reads only for sensing the ICI of the target row. The mock read may be used to estimate the interference state of the target row. Performing the mock read may include using a fixed (or predetermined) set of mock thresholds to read the target row.

Figure 6:
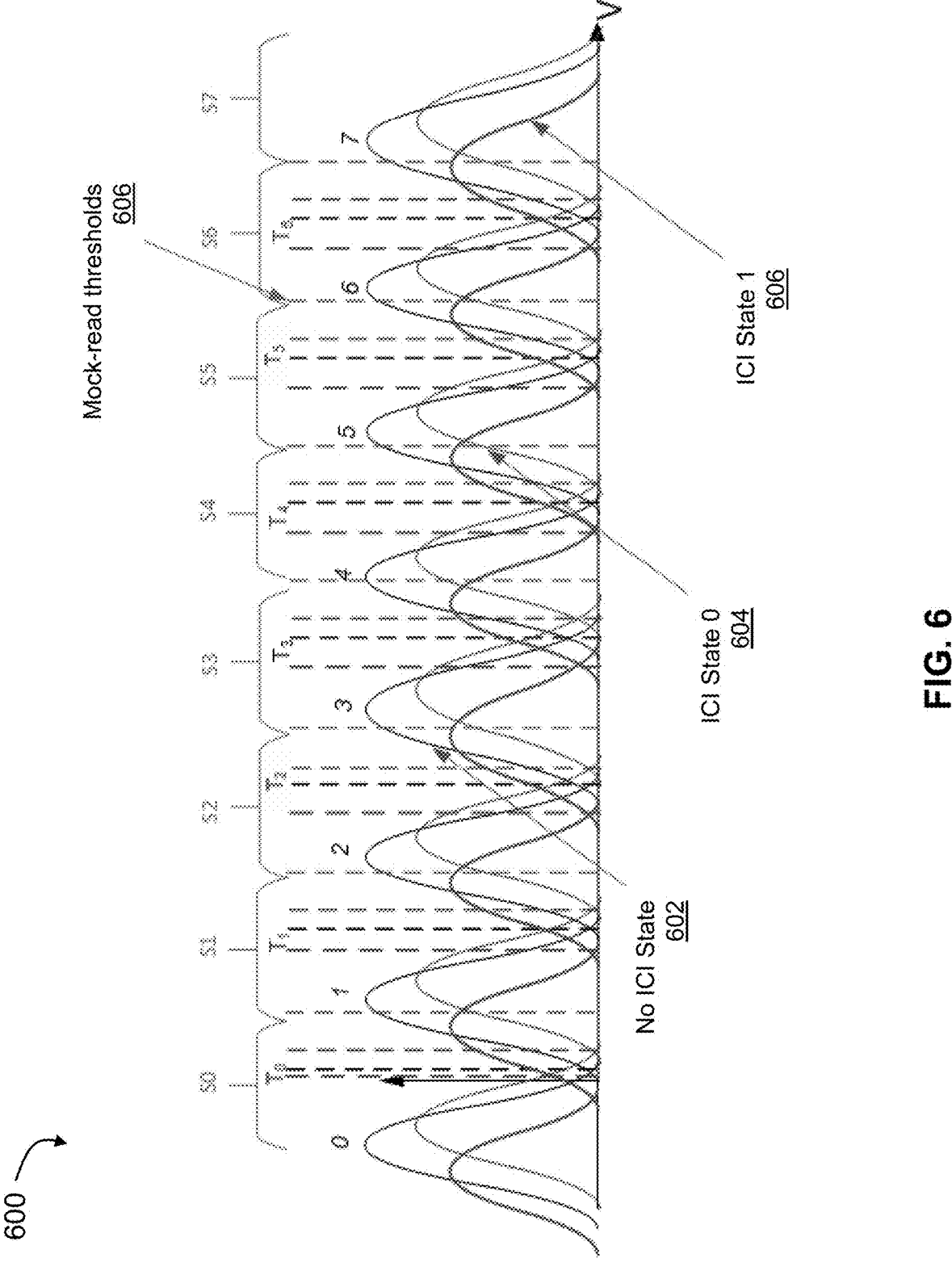
FIG. 6 is a diagram of mock-read thresholds superimposed on a set of histograms, according to an arrangement.

The mock read threshold may be used to facilitate the estimation of the optimal (or improved) compensation for each histogram, as described herein. The selection of the mock read thresholds may be optimized according to one or more of the following criteria: (1) minimizing the read-flow overhead while meeting the reliability specification such that the minimal set of required mock thresholds (or a reduced set of mock thresholds) to compute a histogram with ICI information may be selected; (2) minimize the MMSE of added BER due to the ICI compensation; (3) minimize the tail distribution of the added BER over all of the stress conditions (e.g., a weighted MMSE). An example of mock read thresholds on histograms is shown in FIG. 6 as described herein.

In block 504, the ICI information of the interference source may be read, where the interference source may be the next word-line row which introduced the interference. If a single read is performed (e.g., of the next word-line) then two ICI states may be identified. For example, there may be one set of thresholds corresponding to a high interference state and another set of thresholds corresponding to a low interference state.

In block 506, a joint histogram using interference information may be computed. The determination of the interference state (e.g., from block 504) allows partitioning of the target row into multiple histograms. The joint histogram may be a higher resolution histogram when compared to a histogram created using mock read measurements. For example, a four-bit histogram may be computed where three bits correspond to the mock read threshold locations S0-S7 and the fourth bit corresponds to the interference state (e.g., state 0 or state 1).

In block 508, read thresholds for the target row and each interference state may be estimated for reduced interference using for example, a linear estimator or artificial intelligence (e.g., a deep-neural network).

Estimated read thresholds for each interference state may be computed from the four-bit histogram determined in block 506. The estimated thresholds allow reading the selected page (e.g., the cells of the page) with reduced BER by optimally compensating the interference noise. In some arrangements, a linear estimator may be used to compute the read-thresholds with ICI compensation (e.g., performed during QT). An example linear estimator is shown in Expression 3:

$$\hat{\underline{V}} = X_{A \times B} \cdot H_{B \times 1} \tag{3}$$

$\hat{\underline{V}}$ is a A×1 vector containing estimation results for thresholds, where the thresholds correspond to a different interference state (e.g., state 0 and state 1). The vector $H_{B \times 1}$ contains the histogram values obtained from the mock reads and ICI single read. Lastly, the matrix $X_{A \times B}$ is the linear estimator coefficients matrix, which may be trained offline on a database of VT distributions containing a sample of the supported stress conditions.

In an example, a database may be configured with VT scans, and predetermined (fixed) mock read thresholds. For a single ICI read for N rows of the database, a set of N histograms may be created. The histogram matrices may be considered $H_{B \times N}$ where N corresponds to a total of N rows in the database with labels corresponding to the optimal thresholds per row. The optimal threshold for each histogram may be indicated by $V_{A \times N}$.

One example linear estimator that minimizes the thresholds estimation mean square error (MMSE) is shown in Expression 4:

$$X_{A \times B} = \min E[\hat{\underline{V}} - \underline{V}]^2 = V_{A \times N} \cdot H^T (H \cdot H^T)^{-1} \tag{4}$$

Where $H_{B \times N}$ is the histograms matrix and $V_{A \times N}$ is the optimal thresholds matrix. The BER associated with estimating a sub-optimal threshold may not be proportional to the threshold error relative to the optimal threshold. To evaluate the effect of the BER on the estimated threshold, the error function may be transformed from a threshold error to a function of added BER vs. threshold error. This can be done for example by using a weight least squares algorithm for iteratively solving the thresholds MMSE by providing weights to each histogram sample, corresponding to the thresholds from previous MMSE iteration. That is, $WMSE = \Sigma w_i (\hat{V}_i - V_i)$ where $w_i$ represents the normalized weight needed to translate the threshold error to BER, and next iteration of Expression (4) to solve the weighted MMSE is given by $X_{A\times B}(\text{iter})=V_{A\times N}\cdot W_{iter}\cdot H^T (H\cdot W_{iter}\cdot H^T)^{-1}$ where $W_{iter}$ is an N×N diagonal matrix with weights $w_i$ on its diagonal. The weights are updated per iteration until weighted MSE loss is minimized. In other implementations, other polynomial functions may be used to compute the added BER as a function of threshold error and performing stochastic gradient descent to minimize the loss.

The estimated read thresholds for each interference state may be computed using the set of M mock thresholds (e.g., described in block 502) jointly with the single read of the ICI information. For example, the estimated read thresholds may be given by Expression 5:

$$\hat{\underline{V}}_{2D}=X_{2D\times 2(M+1)}\cdot H_{2(M+1)\times 1} \qquad (5)$$

Where $\hat{\underline{V}}$ is a 2D×1 vector containing estimation results for D+1 possible programmed states. In the case of a TLC device, D=7 and there may be two sets of seven thresholds where each threshold corresponds to an ICI state. In the case of a QLC device, D=15 may be the number of estimated thresholds. In Expression 5, the histogram vector of 2(M+1) may reflect the histogram size. For example, when M mock read thresholds are used, there are M+1 histograms. The histogram size may be doubled for two ICI states.

In some arrangements, a set of M mock thresholds may be used jointly with multiple reads of ICI information. Accordingly, there may be J ICI states. The read thresholds per ICI state may be shown in Expression 6:

$$\hat{\underline{V}}_{J\cdot D}=X_{J\cdot D\times J\cdot (M+1)}\cdot H_{J\cdot (M+1)\times 1} \qquad (6)$$

Where $\hat{\underline{V}}$ is al D×1 vector containing estimation results for a possible D+1 possible programmed states. In the case of a TLC device, D=7 and there may be two sets of seven thresholds, where each threshold corresponds to an ICI state. In the case of a QLC device, D=15 may be the number of estimated thresholds. In Expression 6 above, the histogram vector of J·(M+1) may reflect the histogram size. For example, when M mock read thresholds are used, there may be M+1 histogram bins multiplied by the number of ICI states J.

In other arrangements, other information may be used to estimate the optimal compensation (or an improved compensation). For example, a single mock threshold may be used to estimate the stress condition (e.g., retention condition, cross-temperature programming). Accordingly, the ICI compensation thresholds will be optimized with respect to the stress classification. The ICI compensation may be applied based on a function of the estimated stress condition, where the ICI compensation may be relative to other read thresholds (e.g., the quick training thresholds determining in block 906 in FIG. 9). Arrangements of determining an ICI compensation as a function of the stress condition will be described with reference to FIG. 11.

In other arrangements, the estimated read thresholds for each interference state may be computed using machine learning. For example, a deep-neural network may be employed. Arrangements of employing a deep-neural network will be described with reference to FIG. 7 and FIG. 8.

Still referring to FIG. 5, in block 510 a read operation may be performed on the target row using the dynamically compensated ICI threshold. In some embodiments, two read operations may be performed with the pair of estimated thresholds (e.g., the thresholds estimated from block 508). The read operations may be combined into a single hard input for hard decoding using the interference read result for separation. Hard decoding may be performed using the read results.

Referring to FIG. 6, a diagram of mock read thresholds superimposed on a set of histograms 600 is illustrated, according to some arrangements. The reads may be three-page reads of a non-volatile memory storage device (e.g., a TLC device) such that information of eight states of the TLC is identified (e.g., SO to S7). As described herein, the mock reads thresholds 606 are used to sense the histograms (e.g., histogram 602 associated with no ICI state, histogram 604 associated with ICI state 0, and histogram 606 associated with ICI state 1) of the target row to facilitate the determination of optimal ICI compensation thresholds conditioned on the interference state.

Figure 7:
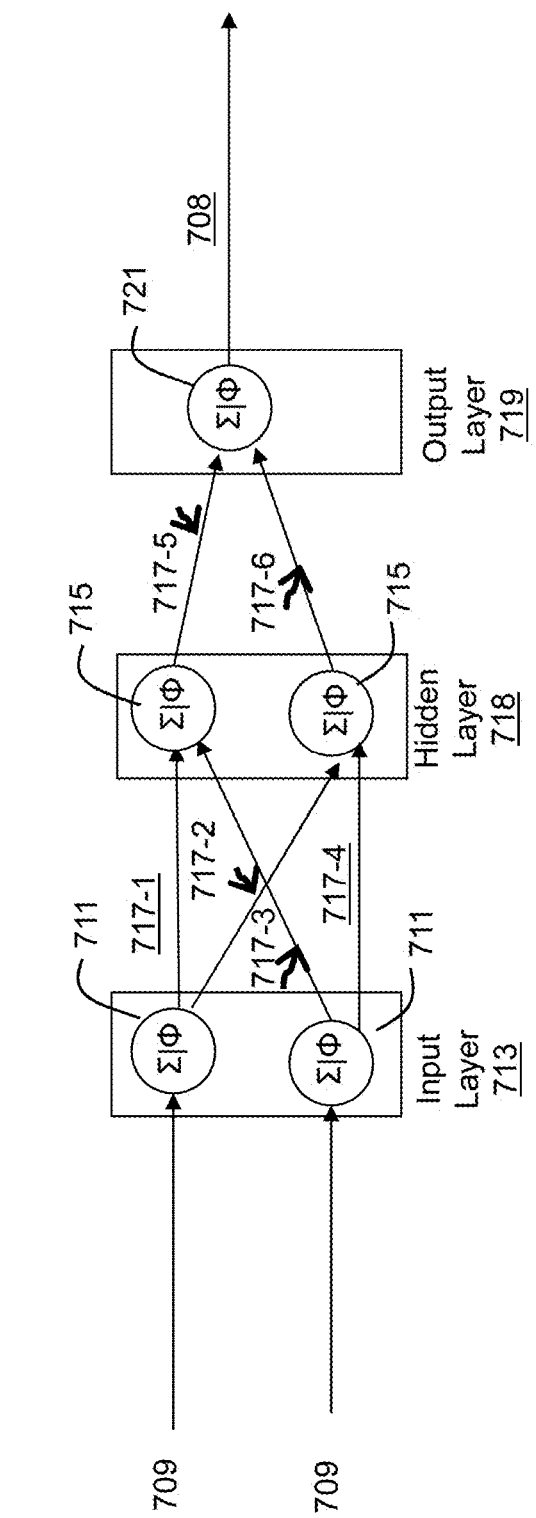
FIG. 7 is a block diagram of a multi-layer perceptron network, according to some arrangements.

Referring to FIG. 7, a block diagram of a multi-layer perceptron network 700 is illustrated, according to some arrangements. As shown, the network 700 is a fully connected network. The neural network 700 may be implemented within the non-volatile storage device 100. For example, the network 700 may be implemented within the controller itself, as a firmware software implementation running via an embedded CPU or as a hardware implementation, depending on the firmware memory and latency performance specifications.

The neural network model 700 may include a stack of distinct layers (vertically oriented) that transform a variable number of inputs 709 being ingested by an input layer 713, into an output 708 at the output layer 719. The network 700 may be trained on a training dataset including the interference state of the target row, the interference state of the interference source, a feature and the corresponding read threshold to dynamically compensate the interference state of the target row. The neural network may be used to estimate accurately the thresholds using one or more of mock reads, ICI read results, and additional features using an input layer 713 and one or more hidden layers 718. In other arrangements, the network 700 may not include any hidden layers 718. The inputs 709 may be received by the input layer 713 as a vector.

The arrangements herein describe network 700 being trained with respect to mock reads, ICI read results, and feature inputs 709. Arrangements however, are not limited to using the network 700 to learn estimated ICI compensation thresholds given those sets of inputs. For example, the network 700 may be used to estimate ICI compensation thresholds using histograms from soft samples, multiple ICI read results, and additional features. In some arrangements, the same network 700 is used to estimate the ICI compensation thresholds but the network is trained differently (e.g., on a different set of inputs 709 and outputs 708 resulting in different weights 717). In other arrangements, a different network is used to estimate the ICI compensation thresholds (e.g., a different number of hidden layers 718 or different network 700 architecture (e.g., support vector machines, random forests)).

The mock reads (or histograms from the soft samples) and one or more ICI read inputs 709 to the network 700 may be a computed histogram vector from the mock reads and ICI reads. The feature inputs 709 may include physical row number, program/erase cycle count, no-ICI commonly estimated thresholds, and other information obtained during a read operation. Some features, like no ICI commonly estimated thresholds may depend on the read flow implementation. In some arrangements, the read with ICI information may follow a threshold tracking state that acquires thresholds without ICI for the target row.

Using feature data in addition to histogram vector information (e.g., from the mock and ICI reads) allows the network 700 to learn, and benefit from, the interplay between the features of the page. For example, training the network 700 to predict/estimate the compensated ICI thresholds with feature data may result in improved estimated compensated ICI threshold. For example, the feature information may convey information about the environment of the page (e.g., stress conditions) that allows the network 700 to better learn the relationship between the estimated compensated ICI thresholds (output 708) and the mock read and ICI read inputs 709.

The input layer 713 includes neurons 711 connecting to each of the neurons 715 of the hidden layer 718. The neurons 715 in the hidden layer 718 connect to neuron 721 in the output layer 719. The output layer 719 generates a vector 708 indicating the estimated read thresholds (e.g., the ICI compensation thresholds). The network 700 may include a number of hidden layers 718 between the input 713 and the output layer 719.

Generally, neurons (711, 715, and 721) perform particular computations and are interconnected to neurons of adjacent layers. Each of the neurons 711, 715 and 721 sum the values from the adjacent neurons and apply an activation function, allowing the network 700 to learn non-linear patterns. The network uses the non-linear patterns to learn non-linear relationships between the inputs (e.g., information associated with the, features, mock reads and ICI read results) and the output (e.g., the estimated ICI compensated threshold).

Each of the neurons 711, 715 and 721 are interconnected by algorithmic weights 717-1, 717-2, 717-3, 717-4, 717-5, 717-6 (collectively referred to as weights 717). Weights 717 are tuned during training to adjust the strength of the neurons. The adjustment of the strength of the neuron facilitates the network 700 ability to learn non-linear relationships. The algorithmic weights are optimized during training such that the network 700 learns estimated compensation thresholds.

Figure 8:
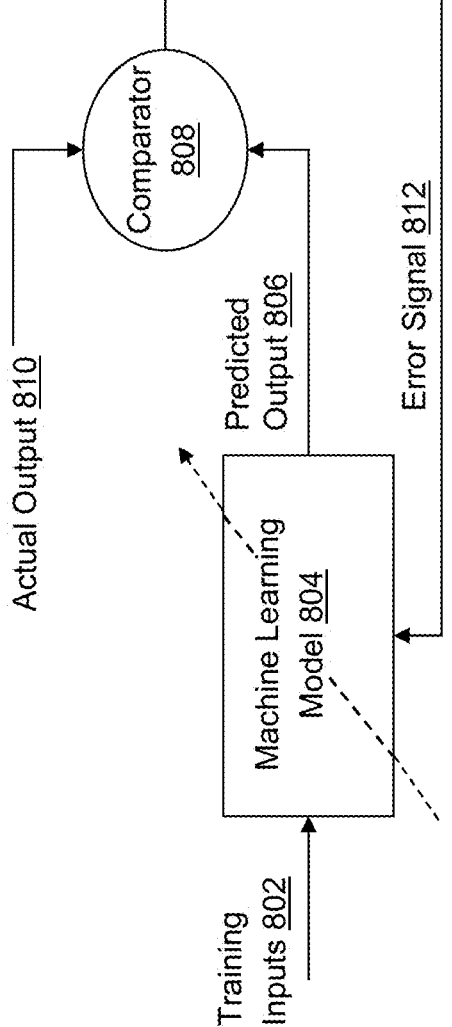
FIG. 8 is a block diagram of a machine learning model using supervised learning, according to some arrangements.

The network 700 may be trained using supervised learning. FIG. 8 is a block diagram of an example 800 machine learning model (e.g., network 700 in FIG. 7) using supervised learning, according to some arrangements. Supervised learning is a method of training a machine learning model given input-output pairs. An input-output pair is an input with an associated known output (e.g., an expected output).

The machine learning model 804 may be trained on known input-output pairs such that the machine learning model 804 can learn how to predict known outputs given known inputs. Once the machine learning model 804 has learned how to predict known input-output pairs, the machine learning model 804 can operate on unknown inputs to predict an output.

Training inputs 802 and actual outputs 810 may be provided to the machine learning model 804. Training inputs 802 may include the mock reads, ICI read results, and features. Actual outputs 810 may include optimal ICI compensated thresholds. The optimal ICI compensated thresholds may be measured and/or determined using a different method of estimating the optimal ICI compensated thresholds as described herein (e.g., estimating the optimum thresholds using the linear estimator).

In an arrangement, the machine learning model 804 may be trained using training inputs 802 (e.g., mock reads, ICI reads, and other features) to predict outputs 806 (e.g., estimated optimum ICI compensated thresholds) by applying the current state of the machine learning model 804 to the training inputs 802. The comparator 808 may compare the predicted outputs 806 to the actual outputs 810 (e.g., actual measured and/or calculated optimum ICI compensated thresholds) to determine an amount of error or differences. For example, the estimated/predicted optimum ICI compensated thresholds (e.g., predicted outputs 806) will be compared to the actual/measured optimum ICI compensated threshold (e.g., actual output 810).

During training, the error (represented by error signal 812) determined by the comparator 808 may be used to adjust the weights in the machine learning model 804 such that the machine learning model 804 learns over time. The machine learning model 804 may be trained using a backpropagation algorithm, for instance. The backpropagation algorithm operates by propagating the error signal 812 through weights in the machine learning model 804 (e.g., weights 717 in FIG. 7). The error signal 812 may be calculated each iteration (e.g., each pair of training inputs 802 and associated actual outputs 810), batch and/or epoch, and propagated through the weights in the machine learning model 804 such that the algorithmic weights adapt based on the amount of error. The error is minimized using a loss function. Non-limiting examples of loss functions may include the square error function, the room mean square error function, and/or the cross entropy error function.

The weighting coefficients of the machine learning model 804 may be tuned to reduce the amount of error, thereby minimizing the differences between (or otherwise converging) the predicted output 806 and the actual output 810. The machine learning model 804 may be trained until the error determined at the comparator 808 is within a certain threshold (or a threshold number of batches, epochs, or iterations have been reached). The trained machine learning model 804 and associated weighting coefficients may subsequently be stored such that the machine learning model 804 may be employed on unknown data (e.g., not training inputs 802). Once trained and validated, the machine learning model 804 may be employed during a testing (or an inference phase). During testing, the machine learning model 804 may ingest unknown data to predict/estimate 8 optimum ICI compensated thresholds. Using the systems and methods described herein, the memory system 100 can have a formalized approach to estimate optimum ICI compensated thresholds.

Figure 9:
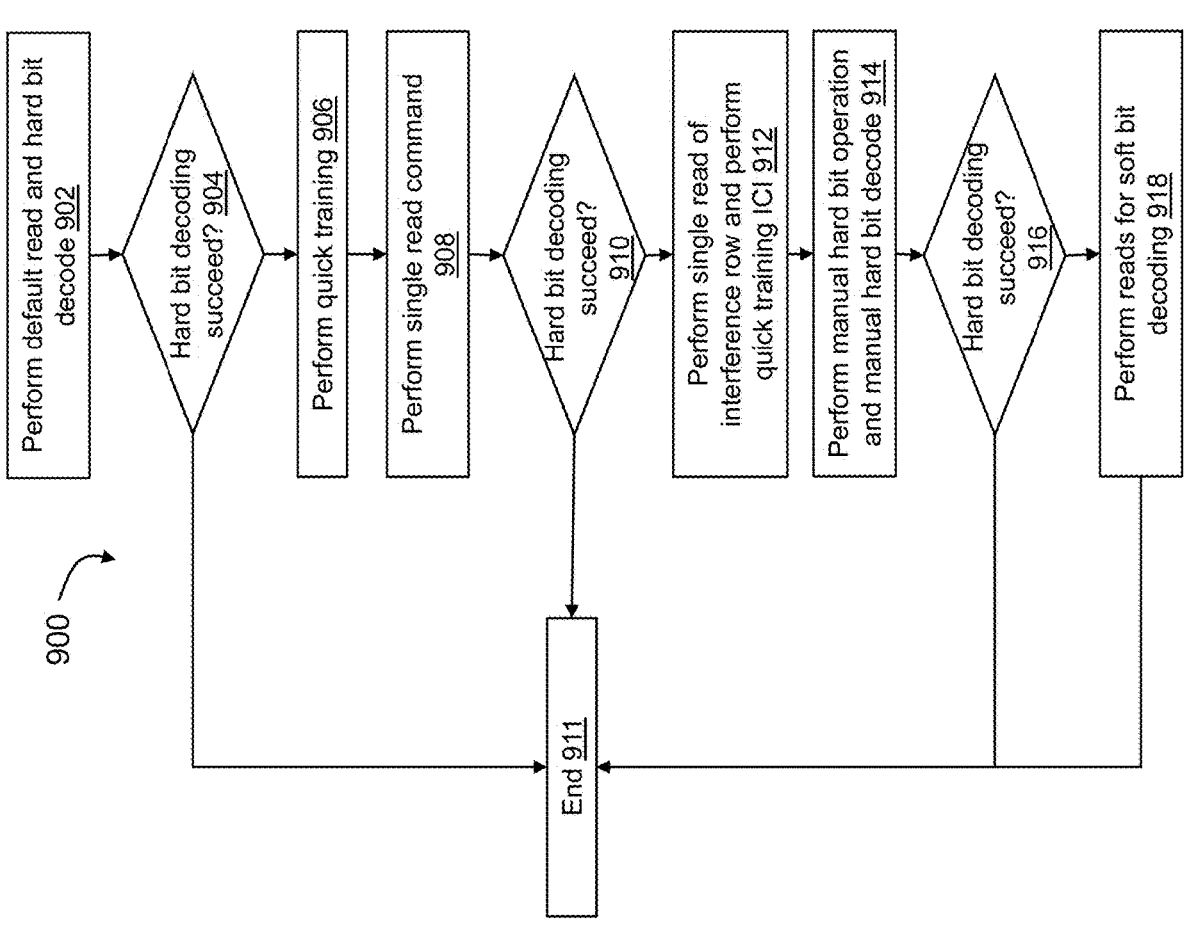
FIG. 9 is a flow chart of a read flow using dynamic ICI compensation thresholds, according to some arrangements.

FIG. 9 is a flow chart of a read flow 900 using dynamic ICI compensation thresholds, according to some arrangements. The read flow 900 is an example of the read operations performed to implement method 500 of dynamically estimating ICI compensation thresholds. The dynamic ICI compensation may be determined using a single ICI read of an interference row. Similar to the maximum number of read operations for the read flow 400 in FIG. 4, the maximum number of read operations for the read flow 900 in FIG. 9 is eight. The read flow 900 utilizes dynamic estimation for ICI compensation without any additional latency overhead compared to the read flow 400 in FIG. 4. Although performing the same number of read operations, the read flow 900 described in FIG. 9 is an improvement of the read flow 400 described in FIG. 4. Using dynamic ICI compensation to determine adapted read thresholds for a target page instead of using fixed ICI compensation may improve the BER and speed of decoding.

Block 902 may be similar to block 402 in FIG. 4. In block 902, a single read command is performed to read a target row. The single read command can be received in a random manner or at an arbitrary time. In some arrangements, the read command may read using default thresholds. The read command may be performed with default thresholds for the target row as usually performed when minimal (or no) prior information is available on the target page/block. If prior information is available, the first read thresholds may be based on history and/or tracking information instead of the default values. For example, the read thresholds may be the read thresholds associated with the previous read command. In some arrangements, the read command may use the last threshold if the time associated with the previous read command is less than 70 microseconds. The reads may be saved on buffers so they may be used later on in the read flow 900. In some arrangements, a hard decoding attempt may be performed on the read results.

Block 904 may be similar to block 404 in FIG. 4. In block 904, it may be determined whether hard decoding of the read result of the target page succeeded. If the hard decoding failed (e.g., due to high error rate), the process may proceed to block 906. If the hard decoding succeeded, the process may end at block 911.

Over time, the hard decoding may be more likely to succeed (and therefore proceed to the end at block 911) because the default thresholds (or the previous thresholds) track the stress condition and/or other changes to the non-volatile memory storage device. Stress conditions may dynamically change according to temperature and/or time. However, in some cases, the temperature may change slowly such that the stress condition and associated compensated threshold may track, resulting in a desirable BER.

For example, at time t=0, the hard decoding may fail and the ICI compensation thresholds may be adjusted as described herein. At time t=1, the hard decoding may likely succeed because the adjusted thresholds determined from the first execution of blocks 902-918 may still be relevant/updated at time t=1. Accordingly, the quality of service may improve based on the self adjusting process of the non-volatile memory storage device. The probability of soft decoding decreases (e.g., the probability of reaching block 918) because the previously updated thresholds track the conditions of the non-volatile memory storage device such that hard bit decoding is more likely to succeed more often. Updating the thresholds such that hard bit decoding is more likely to succeed (e.g., at blocks 904, 910, and 916) frees the processing power and resources of the non-volatile memory storage device. Accordingly, the overall latency resulting from performing reads is decreased because the first read (e.g., performed at block 902) and associated read thresholds are likely relevant at a later time.

Block 906 may be similar to block 406 in FIG. 4. In block 906, a quick training (QT) operation may be performed. The QT operation may use three full page reads from the next word-line using mock thresholds. Histograms may be computed from the full page reads and read thresholds for the target page may be estimated. For example, for two ICI states and three reads, seven thresholds and a three bit histograms of eight states may be determined. The histogram may be used to compute the quick training thresholds (e.g., new thresholds for reading).

Block 908 may be similar to block 408 in FIG. 4. In block 908, a single read command may be performed using the estimated thresholds from block 906. The reads may be saved on buffers so they may be used later on in the read flow. Hard bit decoding may be attempted of the read result on the target page. Block 910 may be similar to block 904. In block 910, it may be determined whether the hard decoding of the read result of the target page succeeded. If the hard decoding failed, the process may proceed to block 912. If the hard decoding succeeded, the process may end at block 911.

In block 912, a single read of a main interference row (e.g., the next word-line row) may be performed. QT ICI may then be performed, in which a histogram with ICI read and mock reads may be computed. The ICI information from the interference row and the mock reads (e.g., reads performed during block 906) may be used during ICI compensation estimation with the histogram to compute the dynamic ICI shift thresholds per ICI state. ICI compensation thresholds corresponding to ICI states may be generated using the DNN or linear estimator, as described herein (e.g., FIGS. 7 and 8). For example, two sets of ICI compensation thresholds may be generated for two ICI states.

Similar to block 414 in FIG. 4, in block 914, a manual hard bits operation may be performed. The manual hard bit operation may include applying the QT ICI threshold from block 912 as a function of the ICI state (e.g., ICI state 0 or ICI state 1) per threshold.

Two additional reads may be performed using the QT ICI thresholds. Labeling may be performed, where a single input hard bit codeword is formed by choosing the parts according to ICI state information from the two read results. In some arrangements, a hard decoding attempt may be performed on the read results.

Block 916 may be similar to block 416 in FIG. 4. In block 916, it may be determined whether hard decoding of the read result of the target page succeeded. If the hard decoding failed, the process may proceed to block 918. If the hard decoding succeeded, the process may end at block 911.

Block 918 may be similar to block 418 in FIG. 4. In block 918, two additional reads (or other reads) may be performed to obtain soft bit information such that soft bit decoding may be performed (e.g., using the soft information generator 113 of FIG. 1). The soft bit decoding read flow is described with reference to FIGS. 12 and 14 as described herein.

Figure 10:
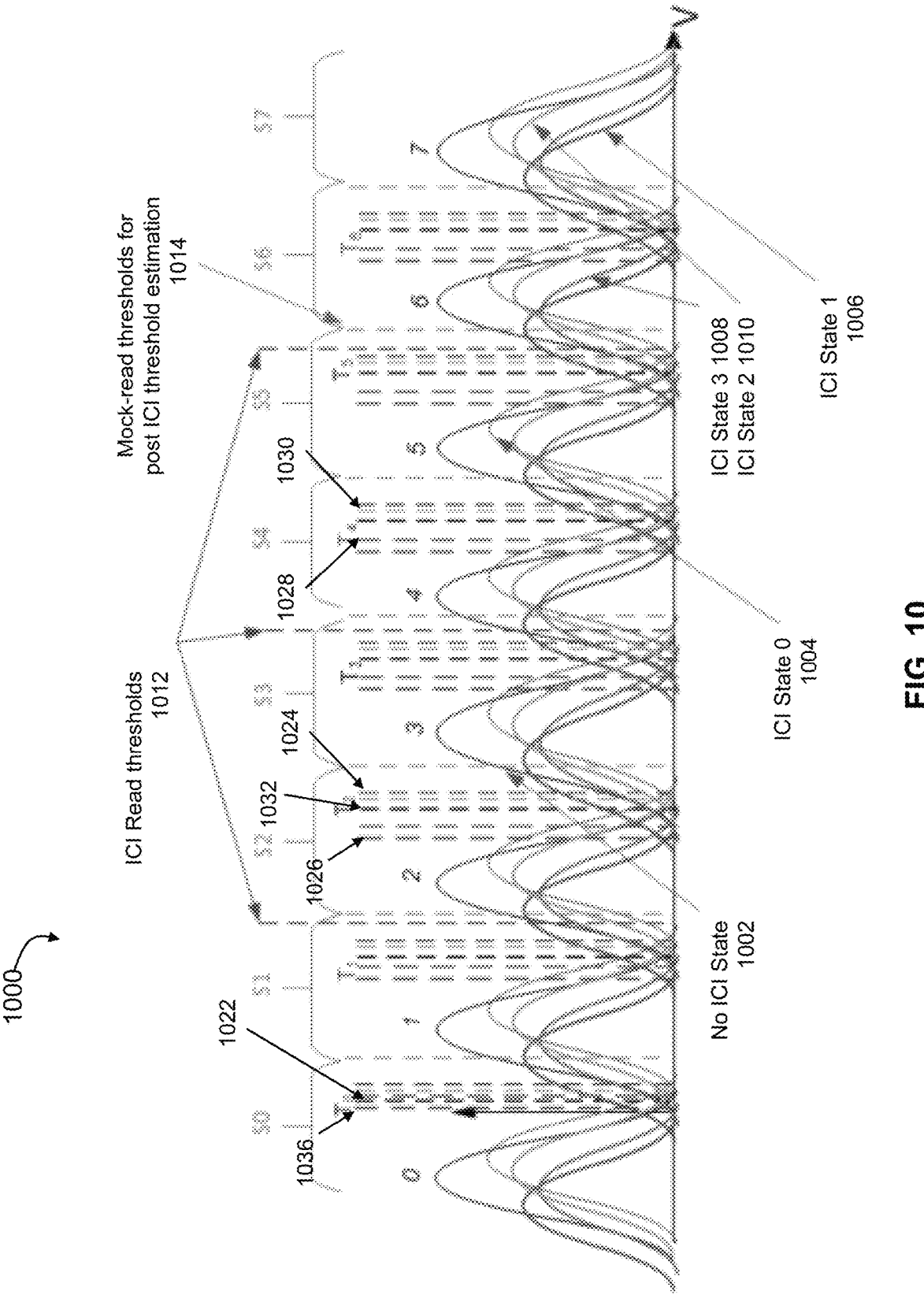
FIG. 10 is diagram of histograms of a target row being read with example VT distributions for each programmed state of a TLC NAND row, according to some arrangements.

FIG. 10 is a diagram an example 1000 of histograms of a target row being read with example VT distributions for each programmed state of a non-volatile memory storage device (e.g., a TLC NAND row), according to some arrangements. In FIG. 10, three threshold reads (e.g., ICI read thresholds 1012) of the next word-line have been performed, resulting in 4 ICI interference states and four unique histograms (e.g., no ICI state histogram 1002, ICI state 0 histogram 1004, ICI state 1 histogram 1006, ICI state 2 histogram 1010 and ICI state 3 histogram 1008). Each histogram is obtained by computing the VT distribution for cells of the target row, corresponding to read results of corresponding ICI states on the neighbouring interfering row.

In example 1000, threshold 1022, associated with no ICI state histogram 1002, is the optimal read threshold which provides the minimal output BER per threshold when there is no ICI information. That is, threshold 1016 is the threshold associated with the no ICI state histogram 1002.

As discussed herein with reference to the voltage shifts of varying offset from the optimum compensation threshold, each ICI state has a unique compensation threshold that is offset from the optimum threshold 1022 (e.g., threshold 1024 associated with ICI state 0 histogram 1004, threshold 1026 associated with ICI state 1 histogram 1006, threshold 528 associated with ICI state 3 histogram 508, and threshold 530 associated with ICI state 2 histogram 510). As discussed herein, while each ICI state has a unique effect on the optimal read threshold (e.g., shifting left or right from the optimal read threshold associated with needing a lower or higher voltage respectively), the offset varies for each of the conditional ICI distributions. For example, when compared to the optimal thresholds 1022 and 1032, the shift of the read threshold associated with ICI state 1 varies from threshold 1036 to threshold 1026 respectively.

With reference to FIGS. 5, 9, 10 and 11, ICI compensated thresholds may be dynamically determined to improve the BER. FIG. 10 describes the four ICI state scenario and FIG.

11 (described further herein) describes the two ICI state scenario. For example, method 500 in FIG. 5 may be executed to determine dynamic ICI compensated thresholds per ICI state. Read flow 900 is one example read flow to execute method 500 in FIG. 5. In block 902, a read command may be performed on the target row using predetermined default thresholds. In the example 1000 of FIG. 10, it will be assumed that hard bit decoding did not succeed (e.g., block 904 in FIG. 9). Referring back to read flow 900 in FIG. 9, in block 906, quick training may be performed such that two optimal read thresholds are determined. Referring to example 1000 in FIG. 10, as shown, three full page read operations from the next word-line of the interfering row were performed using thresholds 1012 to obtain four ICI states. Similarly, referring to example 1100 in FIG. 11, three full page read operations from the next word-line of the interfering row were performed using thresholds 1112 to obtain two ICI states. Referring back to FIG. 10, five-bit histograms may be computed in which three bits correspond to the mock-read threshold locations S0-S7 using mock read thresholds 1014 and bits four and five and correspond to interference states (e.g., ICI state 3, ICI state 2 ICI state 1 or ICI state 0).

In the example, a linear estimator is used to compute the read thresholds using the mock read thresholds and the single read of the ICI information. The linear estimation may be obtained by $\hat{\underline{V}} = X_{28 \times 32} \cdot H_{32 \times 1}$, where $\hat{\underline{V}}$ is a 28×1 vector containing estimation results for four sets of seven thresholds. Each set of seven thresholds corresponds to a different interference state (e.g., interference states 0-3). The vector $H_{32 \times 1}$ contains the histogram values obtained from the mock reads (e.g., read performed at block 902 in FIG. 9) and three single ICI reads (e.g., results of quick training in block 906 in FIG. 9). The matrix $X_{28 \times 32}$ is the linear coefficients matrix.

An example of a linear estimator that minimizes the thresholds estimation MMSE is $X_{28 \times 32} = \min E [\hat{\underline{V}} - \underline{V}]^2 = V_{28 \times N} \cdot H^T (H \cdot H^T)^{-1}$ where $H_{32 \times N}$ denotes the N histogram matrices and $V_{28 \times N}$ denotes optimal thresholds associated with N histogram matrices.

Referring back to the read flow 900 in FIG. 9, in block 908, a single read command may be performed using the estimated thresholds from block 906 (e.g., threshold 1032 associated with no ICI state histogram 1002, threshold 1024 associated with ICI state 0 histogram 1004, threshold 1026 associated with ICI state 1 histogram 1006, threshold 1028 associated with ICI state 3 histogram 1008, and threshold 1030 associated with ICI state 2 histogram 1010 in FIG. 10). The single read operation may be performed on the target row without ICI. In the example, it will be assumed that hard bit decoding did not succeed using the estimated thresholds (e.g., block 910). In block 912, a single read of the next word-line row may be performed to get ICI information. That is, ICI states 0 and 1 may be obtained. Quick training ICI may be performed to compute a histogram with ICI read and mock reads. The histogram may be a four-bit histogram used to compute two sets of thresholds for optimal dynamic ICI compensation. If there were four ICI states, then a five-bit histogram may be used to dynamically compute ICI shift thresholds per ICI state. In block 914, two read are combined using ICI states to provide a hard input for the decoder.

Figure 11:
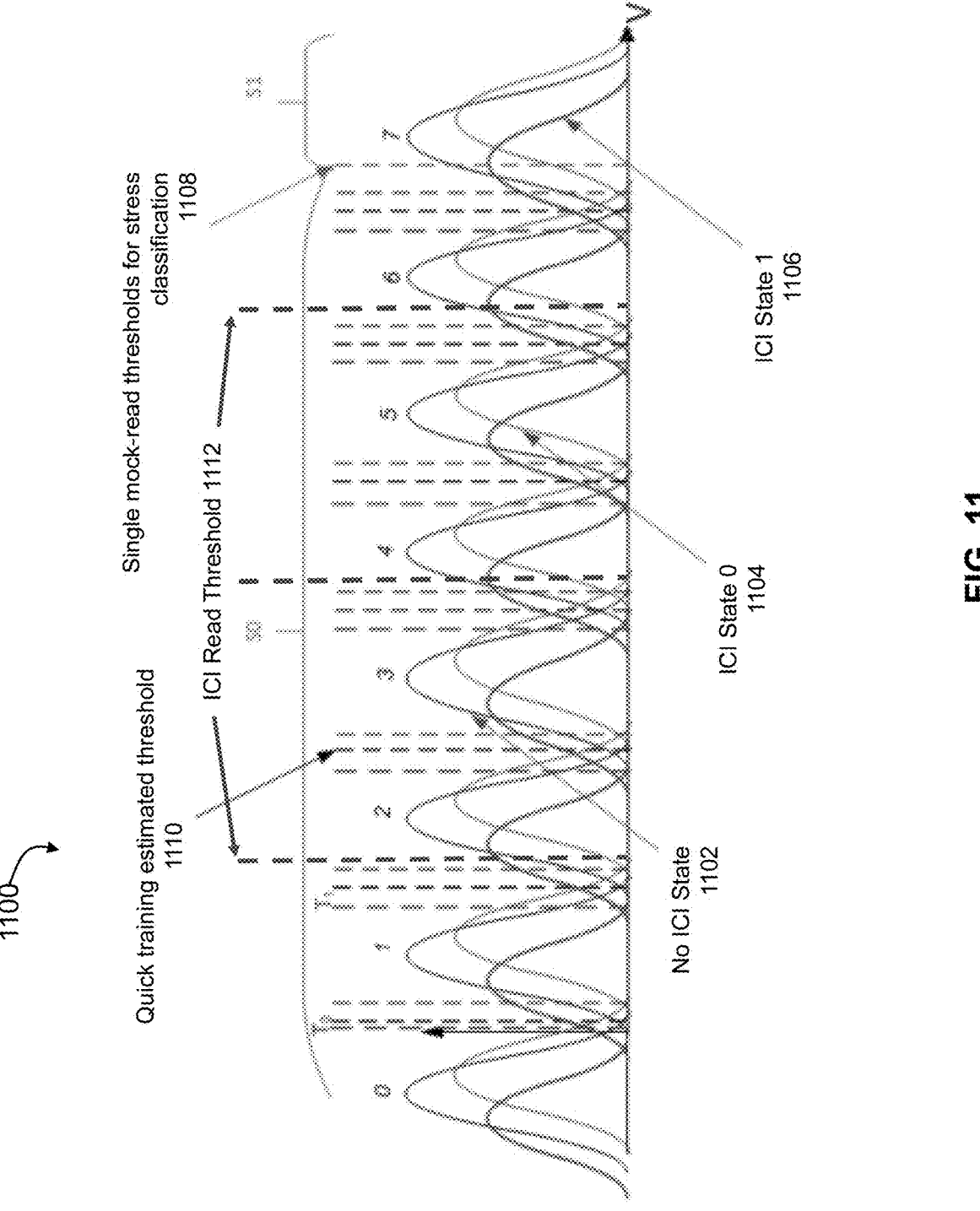
FIG. 11 is a diagram of ICI compensation as a function of the stress condition classification.

FIG. 11 is a diagram of an example 1100 of ICI compensation as a function of the stress condition classification, according to some arrangements. Classifying the stress condition and determining the ICI compensation based on the stress condition classifications tracks the ICI compensation thresholds to the stress conditions (e.g., if there is more stress, the ICI compensation thresholds will be modified such that the thresholds track the stress conditions, improving the BER). As shown, a single mock read threshold 1108 may be used to classify the stress condition. The result of the mock read threshold may be used in updating the quick training threshold 1110 (e.g., in block 906 in FIG. 9). The other ICI compensation thresholds may also be updated using the results from the stress classification. The compensation thresholds may depend on the stress condition classification.

In an example, four stress conditions may be represented by S={program disturb (PD), read disturb (RD), data retention (DR), cross temperature stress (CT)}. The program disturb stress condition (also known as endurance stress) may be the stress resulting from the application/performance of multiple program erase operations. The read disturb stress condition may be the stress resulting from noise created by various read operations on a specific block. Data retention may be a stress condition related to the time (e.g., a long time) and temperature (e.g., a high temperate) resulting from programming, until a read is attempted. The cross temperature stress condition may be the stress associated with programming being done at one temperature (e.g., −40C) and a read being performed at a different temperature (e.g., +85C).

Figure 12:
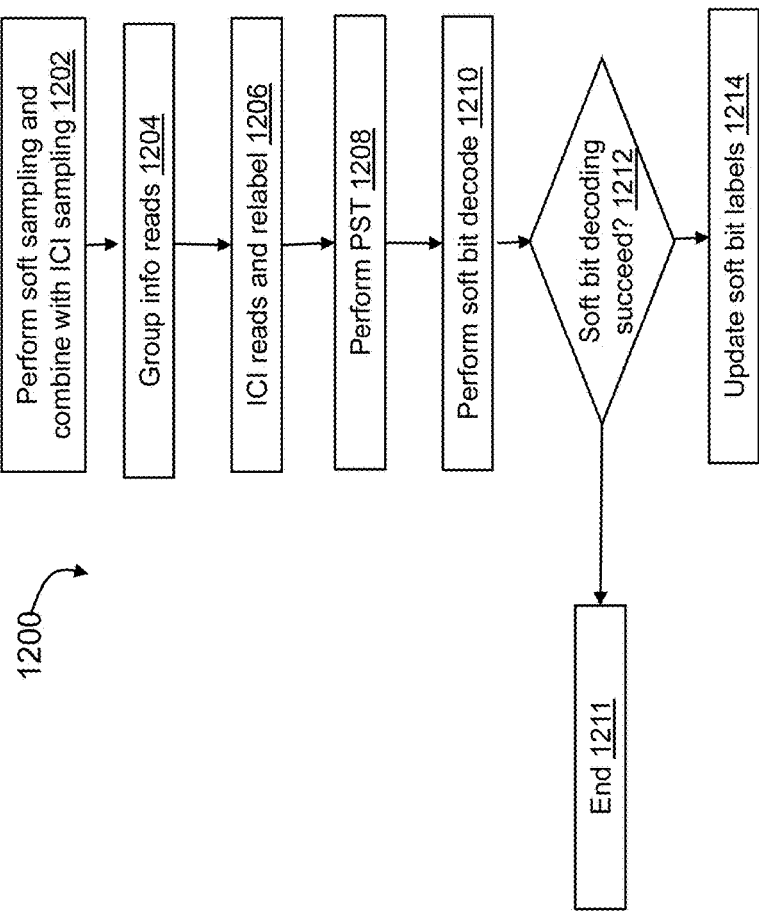
FIG. 12 is a soft bit decoding read flow to determine read thresholds for ICI compensation utilizing fixed ICI compensation for multiple ICI reads, according to some arrangements.

The read thresholds for each ICI state (e.g., ICI state 0 and ICI state 1) may be the quick training thresholds as shown in Expression 7:

$$\hat{V}_0 = \hat{V}_{QT} - \Delta_0(\hat{S})$$

$$\hat{V}_1 = \hat{V}_{QT} + \Delta_1(\hat{S}) \tag{7}$$

Where $\hat{V}_{QT}$ is a vector of the estimated read thresholds (e.g., the read thresholds from block 902 in FIG. 9), $\hat{S}$ is the estimated stress class, $\hat{V}_i$ (for i=0,1) may be the read thresholds for the ICI state 0 and 1 respectively, and $\Delta_i(\hat{S})$ (for i=0,1) may be the compensation shift function dependent on the stress class per ICI state 0 and 1 respectively FIG. 12 is a soft bit decoding read flow 1200 to determine read thresholds for ICI compensation utilizing fixed ICI compensation for multiple ICI reads, according to some arrangements. The soft read flow 1200 uses soft bit sampling of the target row. In an example, the number of reads in the read flow 1200 is 36. Soft bit sampling may be used to estimate the read thresholds for ICI compensation to improve quality of service and estimation accuracy. In some arrangements, read flow 1200 is performed when the hard decoding fails (e.g., after read flow 400 in FIG. 4 fails).

In this example, the process being in block 1202 where soft sampling is performed and combined with ICI sampling. In an example, five-bit resolution soft sampling is performed around thresholds (e.g., QT thresholds estimated from the read flow 400 of fixed ICI compensation for hard bit decoding in from block 406 in FIG. 4). In some configurations, the number of reads performed for soft sampling may be 31.

In block 1204, a group read may be performed. The group info reads may be used to distinguish between cells around each target threshold. For example, two reads may be performed to separate lobe regions of the histograms. In an example, a TLC NAND may use two single state reads to separate three thresholds (e.g., FIG. 2).

In block 1206, ICI reads and re-labeling may be performed. For example, three reads of a next word line may be used to determine four ICI states. Then, a fixed shift on the soft samples is applied for each ICI state. For example, fixed (or predetermined) labels may be applied to relabel ICI compensation thresholds. The shift on soft samples is a re-mapping operation of the initial soft LLR to a different soft LLR depending on the shift per state.

In block 1208, pre-soft tracking (PST) may be performed. PST may be an algorithm that uses the soft labels to determine optimal thresholds. A simple example for a PST algorithm includes computing a histogram of soft sampled inputs around a specific threshold and determining the minimal BER thresholds by the location of the histogram minimum. When ICI states are available, the minimum of a histogram for each ICI state may be used to determine the optimal (dynamic) thresholds for ICI compensation.

PST may be performed before soft decoding the soft samples. As a result of performing PST, soft bit decoding labels may be updated. PST may be used to find the optimal threshold after ICI compensation for each of the target page thresholds per group. That is, the hard decoding decision thresholds per group may be adjusted after ICI compensation using soft sampling and relabeling. PST may be applied for each ICI state.

If there is no ICI information, histograms of soft sample VT distributions may be computed using a minimum search and/or model fit (e.g., Laplacian distribution) for histograms around each target threshold. The optimal threshold may be estimated, and the soft samples may be mapped to LLRs.

PST tracking may also be applied when multi-state ICI information is available. For each ICI state, corresponding optimal thresholds may be estimated, and LLRs may be assigned to each ICI state to provide the decoder (e.g., ECC decoder 112 of FIG. 1) post ICI compensation LLR inputs. Additionally or alternatively, a neural network (e.g., neural network 700) may be employed to find the optimal thresholds.

In block 1210, soft bit decoding may be performed. For example, a soft decoder (e.g., ECC decoder 112 of FIG. 1) may be used for decoding. In block 1212, it may be determined whether the soft decoding of the target page succeeded. If the soft decoding succeeded, the process may end at block 1211. If the soft decoding failed, the process may proceed to 1214. In an example, the process may proceed to block 1214 if the decoded BER did not satisfy a threshold (e.g., an accuracy threshold).

In block 1214, the soft bit labels may be updated. For example, LLR mapping may be performed on the soft labels. Additionally or alternatively, dynamic LLR estimation may be performed. For example, a soft decoder (EEC decoder 112 of FIG. 1) may generate a temporary error vector by monitoring or examining results of the decoding attempt (e.g., the soft decoding attempt in block 1210). The soft decoder may obtain an adapted LLR mapping or LLR value based on the temporary error vector generated on the failure of previous soft decoding attempts. Dynamic LLR estimation is described in more detail in U.S. Pat. No. 10,963,338, titled "SYSTEM AND METHOD FOR DECODER ASSISTED DYNAMIC LOG-LIKELIHOOD RATIO ESTIMATION FOR NON-VOLATILE MEMORIES," filed on Sep. 12, 2019 by Avi Steiner and Hanan Weingarten, which is incorporated by reference herein in its entirety.

Figure 13:
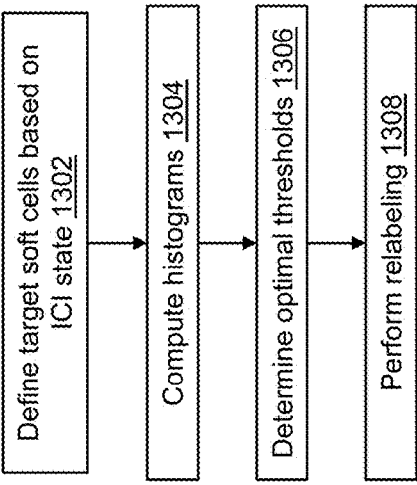
FIG. 13 is a method of dynamically estimating optimum ICI compensation thresholds, according to some arrangements.

FIG. 13 is a method 1300 of dynamically estimating optimum (or improved) ICI compensation thresholds, according to some arrangements. The method 1300 may be performed on soft information. The method 1300 is applied to soft labels for each interference state.

In this example, the process begins in block 1302 where the target soft pages (or cells, group of bits, and/or codeword) are defined based on a given ICI state. The target soft pages (e.g., page bits) may be selected based on read results from a neighboring row. That is, in some implementations, the target soft cells for the threshold search may be the same cells corresponding to a given ICI state.

In block 1304, histograms may be computed around the threshold on labels for the given ICI state. For example, the QT operation and/or PST operation may be used to compute the histograms. Arrangements of computing histograms using the QT operation and/or PST operation are described herein with reference to FIG. 14.

In block 1306, the optimal thresholds for each histogram may be determined. For example, a search for the optimal thresholds may be performed using a model of a normalized histogram. The model can be for example a probability density function (PDF) of a Gaussian distribution, or a Laplace distribution. Given the computed histogram, the PDF model parameters can be estimated, and the optimal thresholds may be computed from the location of minimal errors obtained from the PDF model functions. In some arrangements, the threshold estimation approach may be more accurate when compared to mock-read threshold based estimation because finding the optimal threshold using PST uses more information (because of the use of soft information) regarding the target thresholds.

In block 1308, relabeling may be performed. For example, the estimated ICI compensation threshold may be relabeled to reflect updated (or optimal, improved, tracked) ICI compensation for a given ICI state.

Figure 14:
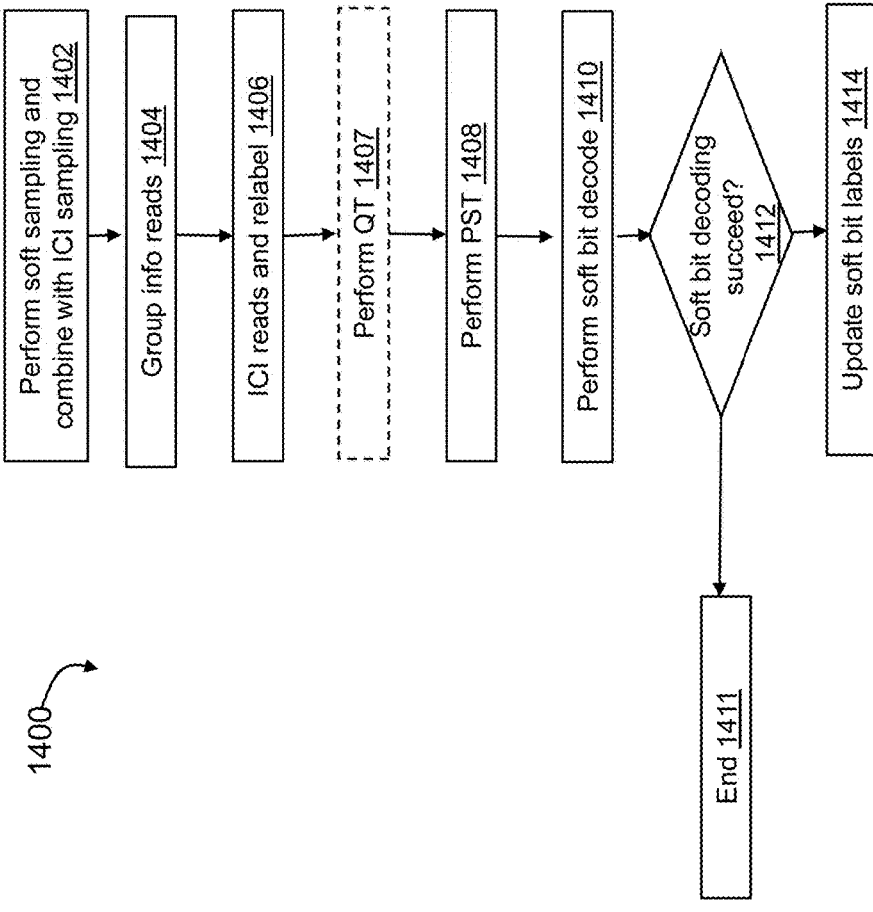
FIG. 14 is a soft bit decoding read flow utilizing dynamic estimation of ICI compensation for multiple ICI reads, according to some arrangements.

FIG. 14 is soft bit decoding read flow 1400 utilizing dynamic estimation of ICI compensation for multiple ICI reads, according to some arrangements. The read flow 1400 is an example of read operations performed to implement method 1300 of dynamically estimating ICI compensation thresholds. The maximum number of read operations for the read flow 1400 is the same number as the maximum number of read operations for the read flow 1200 in FIG. 12 (e.g., 36 reads). Although performing the same number of read operations, the read flow 1400 is an improvement of the read flow 1200 described in FIG. 12. Using dynamic ICI compensation to determine adapted read thresholds for a target page instead of using fixed ICI compensation may improve the BER and speed of decoding. The read flow 1400 utilizes dynamic estimation for ICI compensation without any additional latency overhead compared to the read flow 1200 in FIG. 12.

Block 1402 may be similar to block 1202 in FIG. 12. In block 1402, soft sampling is performed and combined with ICI sampling. In an example, five-bit resolution soft sampling is performed around thresholds (e.g., QT thresholds estimated from the read flow 900 of dynamic ICI compensation for hard bit decoding in from block 912 in FIG. 9). In some configurations, the number of reads performed for soft sampling may be 31.

Block 1404 may be similar to block 1204. In block 1404, a group read may be performed. The group info reads may be used to distinguish between cells around each target threshold. For example, two reads may be performed to separate lobe regions of the histograms. In an example, a TLC NAND may use two single state reads to separate three thresholds (e.g., FIG. 2).

Block 1406 may be similar to block 1206 in FIG. 12. In block 1406, ICI reads and re-labeling may be performed. For example, three reads of a next word line may be used to determine four ICI states.

In block 1407, QT may be performed. QT may be performed if the QT mock reads were saved from the hard decoding read flow (e.g., the mock read threshold determination in read flow 900 and particularly in block 906 in FIG. 9). A QT operation may be performed using the previous mock read thresholds (as discussed) and ICI reads so as to compute ICI compensation for each ICI state. For example, using ICI state per bit and the mock reads, histograms may be computed and per state ICI compensation thresholds may be estimated. The estimated threshold shifts may be applied to each ICI state. The shift on soft samples is a re-mapping operation of the initial soft LLR to a different soft LLR depending on the shift per state.

Block 1408 may be similar to block 1208 in FIG. 12 if the QT was performed in block 1407. In block 1408, PST may be used to find the optimal threshold after ICI compensation for each of the target page threshold per group. That is, the hard decoding decision thresholds per group may be adjusted after ICI compensation using soft sampling and relabeling. PST may be applied for each ICI state.

If block 1407 was not performed (e.g., the mock reads from the hard decoding read flow were not saved), then block 1408 may be different from block 1208. For example, in block 1408, ICI compensation per state may be computed using the PST operation. Using the ICI state per bit and the soft samples, histograms may be computed using the ICI state. Compensation thresholds may be estimated using PST per state (e.g. using a linear estimator or a DNN). Each group and state may be relabeled.

Block 1410 may be similar to block 1210. In block 1410, soft bit decoding may be performed. For example, a soft decoder (e.g., ECC decoder 112 of FIG. 1) may be used for decoding. In block 1412, it may be determined whether the soft decoding of the target page succeeded. If the soft decoding succeeded, the process may end at block 1411. If the soft decoding failed, the process may proceed to 1414.

Block 1414 may be similar to block 1214 in FIG. 12. In block 1414, the soft labels may be updated. For example LLR mapping (or dynamic LLR estimation) may be performed on the soft labels.

Figure 15:
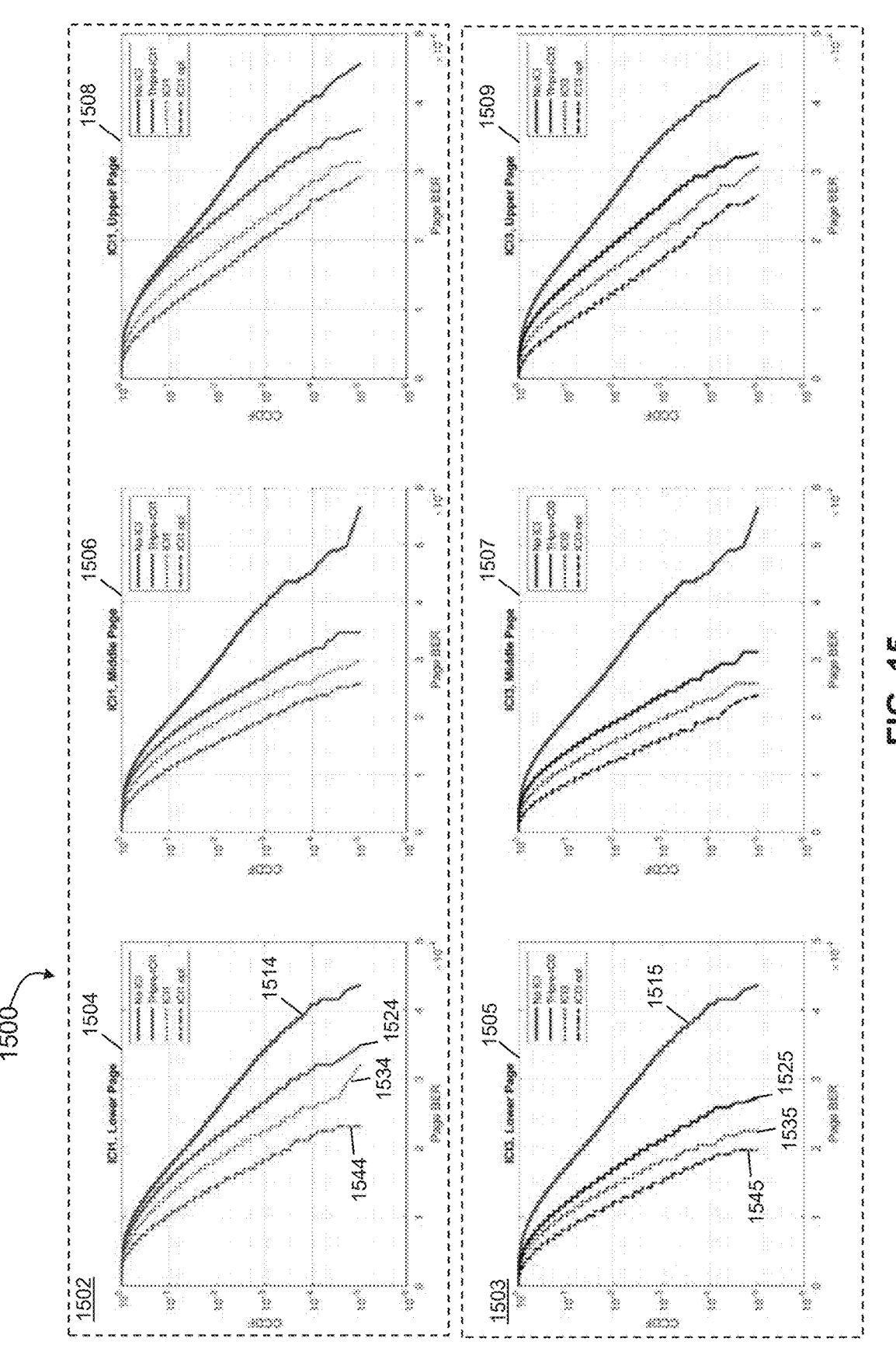
FIG. 15 is an example of BER distribution from a TLC NAND, according to an arrangement.

FIG. 15 is an example 1500 of BER distribution from a non-volatile memory storage device such as a TLC NAND, according to an arrangement. Graphs 1502 and 1503 correspond to BER distributions per page. For example, graph 1504 and 1505 indicate a BER distribution for a lower page, graph 1506 and 1507 indicate a BER distribution for a middle page, and graph 1508 and 1509 indicate a BER distribution for an upper page. The x-axis of graphs 1502 and 1503 indicate a BER and the y-axis of graphs 1502 and 1503 indicate a complimentary cumulative distribution function (CCDF).

As shown in the example 1500, the lower page 1504 BER distribution without ICI reads is line 1514. The lower page 1504 BER distribution with fixed compensation with a single ICI read (e.g., read flow 400 in FIG. 4) is line 1524. The lower page 1504 BER distribution with single ICI read given adjusted optimal thresholds post compensation is line 1534. However, adjusting the optimal thresholds post compensation may not be efficient because the adjustment involves additional overhead resulting from threshold tracking. The lower page 1504 BER distribution with dynamic compensation with single ICI read (e.g., read flow 900 in FIG. 9) is line 1544.

As shown in the example 1500, the lower page 1505 BER distribution without ICI reads is line 1515. The lower page 1505 BER distribution with fixed compensation three-read ICI (e.g., read flow 400 in FIG. 4) is line 1525. The lower page 1505 BER distribution with fixed compensation three-read ICI given adjusted optimal thresholds post compensation is line 1535. However, adjusting the optimal thresholds post compensation may not be efficient because the adjustment involves additional overhead resulting from threshold tracking. The lower page 1505 BER distribution with dynamic compensation with three-read ICI (e.g., read flow 900 in FIG. 9) is line 1545.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout the previous description that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

It is understood that the specific order or hierarchy of steps in the processes disclosed is an example of illustrative approaches. Based upon design preferences, it is understood that the specific order or hierarchy of steps in the processes may be rearranged while remaining within the scope of the previous description. The accompanying method claims present elements of the various steps in a sample order, and are not meant to be limited to the specific order or hierarchy presented.

The previous description of the disclosed implementations is provided to enable any person skilled in the art to make or use the disclosed subject matter. Various modifications to these implementations will be readily apparent to those skilled in the art, and the generic principles defined herein may be applied to other implementations without departing from the spirit or scope of the previous description. Thus, the previous description is not intended to be limited to the implementations shown herein but is to be accorded the widest scope consistent with the principles and novel features disclosed herein.

The various examples illustrated and described are provided merely as examples to illustrate various features of the claims. However, features shown and described with respect to any given example are not necessarily limited to the associated example and may be used or combined with other examples that are shown and described. Further, the claims are not intended to be limited by any one example.

The foregoing method descriptions and the process flow diagrams are provided merely as illustrative examples and are not intended to require or imply that the steps of various examples must be performed in the order presented. As will be appreciated by one of skill in the art the order of steps in the foregoing examples may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm steps described in connection with the examples disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the examples disclosed herein may be implemented or performed with a general purpose processor, a DSP, an ASIC, an FPGA or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some steps or methods may be performed by circuitry that is specific to a given function.

In some exemplary examples, the functions described may be implemented in hardware, software, firmware, or any combination thereof. If implemented in software, the functions may be stored as one or more instructions or code on a non-transitory computer-readable storage medium or non-transitory processor-readable storage medium. The steps of a method or algorithm disclosed herein may be embodied in a processor-executable software module which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

The preceding description of the disclosed examples is provided to enable any person skilled in the art to make or use the present disclosure. Various modifications to these examples will be readily apparent to those skilled in the art, and the generic principles defined herein may be applied to some examples without departing from the spirit or scope of the disclosure. Thus, the present disclosure is not intended to be limited to the examples shown herein but is to be accorded the widest scope consistent with the following claims and the principles and novel features disclosed herein.

What is claimed is:

1. A method comprising:
performing a hard decoding for a read operation in response to a read command, wherein the hard decoding comprises:
identifying a mock read threshold for a target row;
performing a read operation on an interference source not included in the target row to thereby determine an interference state of the interference source;
computing a histogram for the target row and the determined interference state based on one or more mock reads of the target row using the mock read threshold;
estimating a read threshold for the target row to dynamically compensate an interference noise of the target row corresponding to the determined interference state;
performing the read operation on the target row using the estimated read threshold corresponding to the determined interference state to obtain input for the hard decoding; and
performing a soft decoding for the read operation using log likelihood ratio (LLR) information only if the hard decoding fails using the obtained input and without the LLR information.

2. The method of claim 1, wherein the interference source is a next word line row.

3. The method of claim 1, wherein estimating the read threshold comprises using a linear estimator, wherein an output vector of the linear estimator contains the read threshold to dynamically compensate the interference state of the target row, an input vector of the linear estimator contains a voltage distribution value of the histogram, and a matrix of the linear estimator contains coefficients.

4. The method of claim 1, wherein estimating the read threshold comprises using a neural network trained using a training dataset comprising a second interference state of a second target row, a second interference state of a second interference source, a feature and a corresponding read threshold to dynamically compensate the interference state of the second target row.

5. The method of claim 4, wherein the feature comprises at least one of a physical row number, a program cycle count, an erase cycle count, or a no-inter cell interference threshold.

6. The method of claim 1, further comprising:
performing a sensing operation on the target row to classify a stress condition; and
updating the read threshold estimated using the histogram based on the stress condition.

7. The method of claim 1, wherein the read threshold to dynamically compensate the interference noise of the target row is offset by a unique voltage from an ideal read threshold.

8. A method comprising:
performing a hard decoding for a read operation in response to a read command, wherein the hard decoding comprises:
defining a target group of bits based on an interference state of the target group of bits based on interference sampling comprising soft sampling of the target group of bits and sampling of an interference source not included in the target group of bits;

determining a histogram for the target group of bits;

estimating, a read threshold for the target group of bits to dynamically compensate an interference noise of the target group of bits caused by the interference source;

performing the read operation on the target group of bits using the estimated read threshold corresponding to the determined interference state to obtain input for the hard decoding;

forming a single hard bit codeword using the obtained input from the read operation that was performed using the estimated read threshold; and performing the hard decoding on the formed single hard bit codeword.

9. The method of claim 8, wherein determining the histogram and the corresponding threshold comprises:

retrieving an interference threshold and a corresponding interference state of the interference source associated with a read operation; and computing the histogram and estimating the read threshold based on the interference threshold and the corresponding interference state of the interference source.

10. The method of claim 8 further comprising:

adjusting the read threshold estimated for the target group of bits to dynamically compensate the interference noise of the target group of bits based on a relabeling operation.

11. The method of claim 8, wherein determining the histogram and estimating the read threshold comprises:

determining an interference state of the interference source based on sampling a bit of the interference source;

computing a reliability of the sampled bit; and computing the histogram and estimating the read threshold using the reliability of the sampled bit and interference state based on the sampled bit.

12. The method of claim 11, further comprising:

relabeling the reliability of the sampled bit based on a log-likelihood ratio estimation.

13. The method of claim 8, further comprising;

determining, whether a read operation using the estimated read threshold satisfies a bit error rate accuracy.

14. A memory system comprising:

a memory having a page and a plurality of rows; and a circuit for performing operations of the page of memory, the circuit being configured to:

perform a hard decoding for a read operation in response to a read command, wherein in performing the hard decoding the circuit is further configured to:

identify a mock read threshold for a target row of the plurality of rows;

perform a read operation on an interference source not included in the target row to thereby determine an interference state of the interference source;

compute a plurality of histograms for the target row respectively corresponding to a plurality of interference states based on mock reads of the target row using the mock read threshold;

estimate a plurality of read thresholds for the target row to dynamically compensate an interference noise of the target row corresponding to the plurality of interference states using the plurality of histograms; and perform the read operation on the target row using one of the estimated read thresholds corresponding to the determined interference state to obtain input for the hard decoding.

15. The memory system of claim 14, wherein the interference source is a next word line row on the page of memory.

16. The memory system of claim 14, wherein in estimating the plurality of read thresholds, the circuit is further configured to use a linear estimator, wherein an output vector of the linear estimator contains one of the read thresholds to dynamically compensate the corresponding one of the plurality of interference states of the target row, an input vector of the linear estimator contains a voltage distribution value of the corresponding one of the plurality of histograms, and a matrix of the linear estimator contains coefficients.

17. The memory system of claim 14, wherein in estimating the plurality of read thresholds, the circuit is further configured to use a neural network trained using a training dataset comprising a second interference state of a second target row, a second interference state of a second interference source, a feature and a corresponding read threshold to dynamically compensate the interference state of the second target row.

18. The memory system of claim 17, wherein the feature comprises at least one of a physical row number, a program cycle count, an erase cycle count, or a no-inter cell interference threshold.

19. The memory system of claim 14, wherein the circuit is further configured to:

perform a sensing operation on the target row to classify a stress condition; and update the one estimated read threshold based on the stress condition.

20. The memory system of claim 14, wherein the plurality of estimated read thresholds are each offset by a respective unique voltage from an ideal read threshold.

21. A non-transitory processor-readable medium containing processor-readable instructions, such that, when executed by one or more processors, performs a method for dynamically estimating interference compensation thresholds of a page of memory by:

performing a hard decoding for a read operation in response to a read command, wherein the hard decoding comprises:

identifying a mock read threshold for a target row;

performing a read operation on an interference source not included in the target row to thereby determine an interference state of the interference source;

computing a histogram for the target row and the determined interference state based on one or more mock reads of the target row using the mock read threshold;

estimating a read threshold for the target row to dynamically compensate an interference noise of the target row corresponding to the determined interference;

performing the read operation on the target row using the estimated read threshold corresponding to the determined interference state to obtain input for the hard decoding; and performing a soft decoding for the read operation using log likelihood ratio (LLR) information only if the hard decoding fails using the obtained input and without the LLR information.

22. A memory system comprising:

a memory having a page and a plurality of rows; and a circuit for performing operations of the page of memory, the circuit being configured to:

perform a hard decoding for a read operation in response to a read command, wherein in performing the hard decoding the circuit is further configured to:

define a target group of bits based on an interference state of the target group of bits based on interference sampling comprising soft sampling of the target group of bits and sampling of an interference source not included in the target group of bits;

determine a histogram for the target group of bits;

estimate a read threshold for the target group of bits to dynamically compensate an interference noise of the target group of bits caused by the interference source;

perform the read operation on the target group of bits using the estimated read threshold corresponding to the determined interference state to obtain input for the hard decoding;

form a single hard bit codeword using the obtained input from the read operation that was performed using the estimated read threshold; and perform the hard decoding on the formed single hard bit codeword.

23. A non-transitory processor-readable medium containing processor-readable instructions, such that, when executed by one or more processors, performs a method for dynamically estimating interference compensation thresholds of a page of memory using soft information by:

performing a hard decoding for a read operation in response to a read command, wherein the hard decoding comprises:

defining a target group of bits based on an interference state of the target group of bits based on interference sampling comprising soft sampling of the target group of bits and sampling of an interference source not included in the target group of bits;

determining a histogram for the target group of bits;

estimating, a read threshold for the target group of bits to dynamically compensate an interference noise of the target group of bits caused by the interference source;

performing the read operation on the target group of bits using the estimated read threshold corresponding to the determined interference state to obtain input for the hard decoding; and performing a soft decoding for the read operation using log likelihood ratio (LLR) information only if the hard decoding fails using the obtained input and without the LLR information.

24. The method of claim 3, wherein the output vector of the linear estimator includes a plurality of thresholds corresponding to different interference states, and wherein estimating the read threshold includes selecting the read threshold corresponding to the determined interference state from the plurality of thresholds in the output vector.

\* \* \* \* \*